(12) United States Patent
Krishnamoorthy

(10) Patent No.: US 8,732,538 B2
(45) Date of Patent: May 20, 2014

(54) PROGRAMMABLE DATA STORAGE MANAGEMENT

(75) Inventor: Senthil Kumar Krishnamoorthy, Sunnyvale, CA (US)

(73) Assignee: ICForm, Inc., Sunnyvale, CA (US)

(*) Notice: Subject to any disclaimer, the term of this patent is extended or adjusted under 35 U.S.C. 154(b) by 280 days.

(21) Appl. No.: 13/416,027

(22) Filed: Mar. 9, 2012

(65) Prior Publication Data

US 2012/0233523 A1    Sep. 13, 2012

Related U.S. Application Data

(60) Provisional application No. 61/451,139, filed on Mar. 10, 2011.

(51) Int. Cl.
*G11C 29/00* (2006.01)
*G06F 11/10* (2006.01)

(52) U.S. Cl.
CPC ...... *G06F 11/1072* (2013.01); *G11C 2207/102* (2013.01)
USPC .......................................... 714/722; 714/718

(58) Field of Classification Search
CPC ................ G11C 2207/102; G06F 11/1072
USPC .................... 714/722, 718; 365/201
See application file for complete search history.

(56) References Cited

U.S. PATENT DOCUMENTS

| | | | |
|---|---|---|---|
| 6,041,001 A * | 3/2000 | Estakhri | 365/200 |
| 7,013,378 B2 * | 3/2006 | Motta et al. | 711/203 |
| 7,120,729 B2 | 10/2006 | Gonzalez et al. | |
| 7,170,788 B1 | 1/2007 | Wan et al. | |
| 7,218,552 B1 * | 5/2007 | Wan et al. | 365/185.18 |
| 7,355,888 B2 | 4/2008 | Hemink et al. | |
| 7,355,889 B2 | 4/2008 | Hemink et al. | |
| 7,539,920 B2 | 5/2009 | Choi et al. | |
| 7,660,941 B2 | 2/2010 | Lee et al. | |
| 7,716,415 B2 * | 5/2010 | Sharon | 711/103 |
| 7,734,861 B2 | 6/2010 | Li et al. | |
| 8,174,905 B2 * | 5/2012 | Shalvi et al. | 365/185.29 |

(Continued)

OTHER PUBLICATIONS

Jim Chen; Har, D.; Mak, K.; Schulz, C.; Tremaine, B.; Wazlowski, M., "Reliability-availability-serviceability characteristics of a compressed-memory system," Dependable Systems and Networks, 2000. DSN 2000. Proceedings International Conference on , vol., No., pp. 163,168, 2000.*

(Continued)

*Primary Examiner* — Steve Nguyen
(74) *Attorney, Agent, or Firm* — Ash Tankha; Lipton, Weinberger & Husick

(57) ABSTRACT

A method and system for managing storage of one or more data blocks in a programmable data storage device is provided. A data storage controller partitions each of multiple data blocks into multiple sub data blocks comprising a number of bits based on one or more index value descriptors. The data storage controller generates transition vectors from each of the sub data blocks by applying one or more transition functions. The data storage controller encodes one of the transition vectors for each sub data block for obtaining a residual sub data block comprising a reduced number of bits, thereby resulting in increased bit space. The data storage controller generates a composite data block by merging each residual sub data block. The composite data block is configurable for writing to one or more regions in the programmable data storage device free from a disturbance caused by write operations to other regions.

36 Claims, 13 Drawing Sheets

(56) References Cited

U.S. PATENT DOCUMENTS

| | | |
|---|---|---|
| 8,458,568 B2* | 6/2013 | Cideciyan et al. ............ 714/774 |
| 8,533,564 B2* | 9/2013 | Yurzola et al. ................ 714/763 |
| 2010/0042900 A1* | 2/2010 | Khmelnitsky et al. ........ 714/764 |
| 2010/0157675 A1 | 6/2010 | Shalvi et al. |
| 2011/0066922 A1* | 3/2011 | Wezelenburg et al. ....... 714/773 |
| 2011/0320915 A1* | 12/2011 | Khan ............................ 714/773 |

OTHER PUBLICATIONS

Ningde Xie; Guiqiang Dong; Tong Zhang, "Applying transparent lossless data compression to improve the feasibility of using advanced error correction codes in solid-state drives," Signal Processing Systems (SIPS), 2010 IEEE Workshop on , vol., No., pp. 31,35, Oct. 6-8, 2010.*

* cited by examiner

PROGRAMMABLE DATA STORAGE MANAGEMENT

CROSS REFERENCE TO RELATED APPLICATIONS

This application claims the benefit of provisional patent application No. 61/451,139 titled "Programmable Data Storage Management", filed on Mar. 10, 2011 in the United States Patent and Trademark Office.

The specification of the above referenced provisional patent application is incorporated herein by reference in its entirety.

BACKGROUND

The method and system disclosed herein, in general, relates to storing data on a flash memory device. More particularly, the method and system disclosed herein relates to controlling the number of cells programmed to store data in a flash memory device and improving error recovery.

Flash memory devices use floating gates to store data. Flash memory devices comprise cells, for example, single level cells and multi-level cells. A single level cell (SLC) in a flash memory device holds one bit per cell. A multi-level cell (MLC) on a flash memory device holds multiple bits in each cell, which reduces the cost of flash based storage. As fabrication process geometries on flash memory devices shrink and the cells get smaller, charge in the floating gates gets smaller, and the cells are more prone to errors. Moreover, the endurance of each cell, that is, the number of times a cell can be programmed and erased, decreases with process geometries. Multi-level cell flash arrays are particularly susceptible to error due to shrinking geometries. Data retention in flash cells is also affected, for example, by read operations and write operations on neighboring cells, also referred to as read disturb and program disturb respectively.

Using flash memory devices, for example, solid state drives (SSD) to store data and replacing rotating magnetic storage devices, for example, hard disks, is gaining rapid traction due to the reduction in prices of multi-level cell flash memory devices. The data to be stored in the solid state drives requires mapping of logic storage blocks into flash blocks and pages. In most cases, logical addresses have more writes than others. Since the endurance of a page of a flash memory is limited, data from pages that are not frequently used are moved to accommodate pages that are more frequently used. This mechanism for prolonging the service life of solid state drives referred to as "wear leveling" creates write amplification, that is, it increases the number of writes on multi-level cell flash memory devices. Write amplification also occurs due to thresholds associated with read disturb, and from garbage collection to recover storage space from blocks of data that are deleted.

Numerous solutions have been proposed to increase the endurance of flash cells. There are two broad categories of solutions to improve flash memory performance in SSD storage. The first category involves circuit techniques that improve the cells in flash memory devices and associated read/write circuits. In addition, circuit techniques have been proposed to limit the effect of disturb to neighboring cells during a write operation of a block of data. The second category involves signal processing steps that improve data recovery and reduce the effect of cell interactions. Several solutions for program disturb have been proposed which alter the sequence of rows for block writes to flash memory devices. These solutions reformat the data to be stored to match the characteristics of flash memory device cells and arrays. For example, one solution proposes reduction in program disturb by reducing the number of cells that are not programmed and altering the distribution of programmed values. Another solution avoids program disturb by randomizing the data to a flash memory resulting in fewer cells that are not programmed, and changes in the distribution of programmed values when the data remains the same. However, these solutions do not help in applications that need faster programming. These solutions often fail to limit the number of write operations to fewer flash cells. Moreover, these solutions often fail to reduce the number of erase operations on the flash cells by performing erase operations on fewer flash cells. Furthermore, a number of these solutions operate on the original data block rather than reorganizing the data in the data block to enable faster programming. This raises a significant problem since with the probability of bit errors increasing with the shrinking of flash cell sizes, the number of bit fields required to accommodate error correction bits increases. Conventional solutions for improving flash memory performance often store the error correction bits in a separate page and region of the flash memory. However, these solutions are constrained by a predetermined number of bits set for error correction, thereby allowing correction of the same number of bit errors for all data, which does not allow the flexibility of changing the number of error correction bits in accordance with the data programmed in a page.

Hence, there is a long felt but unresolved need for a method and system that manages storage of one or more data blocks in a programmable data storage device by minimizing the number of cells that go through program erase cycles for each write, while minimizing the effect of program disturb. Moreover, there is a need for a method and a system that reduces the number of columns in the programmable data storage device that are to be written. Furthermore, there is a need for a method and system that improves the recovery of a number of bit errors. Furthermore, there is a need for a method and system that reconfigures the data programmed into a page for enabling a dynamic generation of a number of error correction bits for the page based on the reconfigured data, thereby allowing a flexible configuration of error correction bits and improved error correction.

SUMMARY OF THE INVENTION

This summary is provided to introduce a selection of concepts in a simplified form that are further disclosed in the detailed description of the invention. This summary is not intended to identify key or essential inventive concepts of the claimed subject matter, nor is it intended for determining the scope of the claimed subject matter.

The method and system disclosed herein addresses the above stated need for managing storage of one or more data blocks in a programmable data storage device by minimizing the number of cells that go through program erase cycles for each write, while minimizing the effect of program disturb. The reduced write width allows hiding of columns with bad cells, for example, by skipping bad columns. The reduction in the number of bits can be used to speed up writes, that is, by writing fewer columns in a sequence. The reduction in the number of written columns ensures that the usage of the columns can be recycled to improve future write operations and reduce the impact of write disturb, that is, writing fewer columns in any order.

Furthermore, the method and system disclosed herein addresses the above stated need for improving the recovery of a number of bit errors. The increased recovery of bit errors is achieved by addition of more error correction bits, that is, error correcting code (ECC) bits to a composite data block. Furthermore, the method and system disclosed herein address the above stated need for reconfiguring the data programmed into a page for enabling a dynamic generation of ECC bits for the page, based on the reconfigured data, thereby allowing a flexible configuration of the ECC bits and improved error correction. The number of ECC bits can be calculated dynamically based on the data. The method and system disclosed herein enables the transfer of bits in the columns between different programmable data storage devices subsequent to processing of the data, which reduces the effort required in each subsequent copy or wear-leveling write operation. The method and system disclosed enables merging of two or more data blocks during a copy operation performed between programmable data storage devices, thereby improving the transfer bandwidth, improving wear-leveling write operations for reducing write amplification in a programmable data storage device, etc.

The method and system for managing storage of one or more data blocks in a programmable data storage device disclosed herein provides a data storage controller comprising at least one processor configured to control configuration of the data blocks for storage of the data blocks in the programmable data storage device. The data storage controller partitions each of the data blocks comprising multiple bits into multiple sub data blocks based on one or more index value descriptors. As used herein, the term "index value descriptor" refers to a function that defines a sequence of numbers that determines the order of arrangement of bits extracted from a data block for generating new bit streams for sub data blocks from the original bit stream of the data block. Each of the sub data blocks comprises a distinct sequence of a number of bits. Each of the sub data blocks is obtained by extracting bits corresponding to the index value descriptors stored in a lookup table. In an embodiment, the data storage controller creates data redundancy by replicating the bits of each of the data blocks in one or more of the sub data blocks on partitioning the data blocks.

The data storage controller generates transition vectors from each of the sub data blocks by applying one or more transition functions on each of the sub data blocks. The transition vectors constitute a transition set for each of the sub data blocks. As used herein, the term "transition vector" refers to a bit stream comprising bits in a sequence, with a low ratio of one bits herein referred to as "ones" to zero bits herein referred to as "zeros" or a low ratio of zeros to ones, obtained from a bit stream of a sub data block by application of a transition function. One or more of these bit streams have a lowest possible ratio of ones to zeros or zeros to ones. Also, as used herein, the term "transition function" refers to a reversible mathematical transformation that modifies the bit stream of the sub data block to obtain a bit stream with the desired ratio of ones to zeros or zeros to ones. The data storage controller performs one or more reversible mathematical transformations on the distinct sequence of bits in each of the sub data blocks for generating the transition vectors.

In an embodiment, the data storage controller selects one of the transition vectors in the transition set based on selection criteria for encoding the selected transition vector. The selection criteria comprise, for example, one of a predetermined ratio of ones to zeros, a lowest number of ones or zeros, a total number of ones lesser than a predetermined threshold, etc. The data storage controller encodes the selected transition vector for each of the sub data blocks for obtaining a residual sub data block comprising a reduced number of bits for each of the sub data blocks, resulting in increased bit space for accommodating parity bits and error correction bits. As used herein, the term "bit space" refers to a number of vacant bit positions in a data block. Also, as used herein, the term "residual sub data block" refers to a sub data block obtained by replacing the original bit stream in the selected transition vector with the bit stream having the shortest encode length for the selected transition vector. The data storage controller replaces the bits of each of the transition vectors with the encoded bits from each of the transition vectors to obtain residual sub data blocks. The data storage controller, for example, performs run length encoding (RLE) on the selected transition vector for each of the sub data blocks for obtaining the residual sub data block comprising a reduced number of bits for each of the sub data blocks. In an embodiment, the data storage controller generates distinct index value descriptors for partitioning each of the sub data blocks for enabling an optimal performance of encoding of the selected transition vector for each of the sub data blocks.

The data storage controller generates a composite data block by merging the residual sub data block of each of the sub data blocks. As used herein, the term "composite data block" refers to a data block obtained by combining one or more residual sub data blocks. The composite data block comprises increased bit space provided by each residual sub data block. The data storage controller generates and adds one or more parity bits and error correction bits to the composite data block for enabling alignment and error correction of the composite data block. In an embodiment, the data storage controller distributes the generated parity bits and error correction bits in the increased bit space of the composite data block over the length of the composite data block. The distribution of the parity bits and error correction bits through the length of the composite data block, for example, results in a reduction in burst errors. In another embodiment, the data storage controller generates distinct index value descriptors for distributing the error correction bits to one or more regions in the programmable data storage device for reducing burst errors. A "region" in a programmable data storage device, for example, a flash memory device is, for example, a memory column associated with the architecture of the programmable data storage device. Furthermore, the data storage controller inserts information on the index value descriptors and the encoding of the transition vectors to the composite data block. In an embodiment, the data storage controller replicates one or more bits of the composite data block to one or more memory locations in the data storage controller for creating data redundancy. These bits comprise, for example, one or more bits of the encoded transition vector in the composite data block.

The composite data block is configurable for writing the composite data block to one or more of multiple regions in the programmable data storage device free from a disturbance caused by a write operation to other regions in the programmable data storage device. As used herein, the term "disturbance" refers to a corruption of bits stored by a programmable cell or an unintended programming of bits on a programmable cell in a particular region in the programmable data storage device resulting from programming of a neighboring region. In an embodiment, the data storage controller skips or masks adjacent regions that are programmable on the programmable data storage device for performing the writing of the composite data block to one or more regions in the programmable data storage device free from the disturbance caused by the write operation to other regions in the programmable data storage device.

In an embodiment, the method and system disclosed herein provides a weight assignment module external to the data storage controller for assigning weights to one or more regions in the programmable data storage device for distinctly identifying regions free from the disturbance. The assignment of weights is based on, for example, one or more of a location of one or more regions in the programmable data storage device, for example, columns of the flash memory, an organization of programmable cells in the regions, a number of prior write operations performed on the regions, a number of times of movement of bits associated with the regions in the programmable data storage device, etc. The data storage controller configures the composite data block for writing the composite data block to one or more regions in the programmable data storage device by arranging bits of the composite data block according to weights assigned to the regions in the programmable data storage device. In an embodiment, the data storage controller dynamically generates one or more distinct index value descriptors based on weights assigned to the regions in the programmable data storage device for collating bits of the composite data block. The weights distinctly identify one or more regions free from the disturbance. The data storage controller manages storage of the data blocks in the programmable data storage device by organizing the data blocks for each write operation to specific regions in the programmable data storage device and reducing disturbance from writes to other regions in the programmable data storage device without increasing storage size of the programmable data storage device.

In an embodiment, the data storage controller copies the composite data block written to one or more regions in the programmable data storage device to another one or more regions in the programmable data storage device. A decoder in the data storage controller partially decodes the written composite data block based on the dynamically generated distinct index value descriptors. The data storage controller then writes the partially decoded composite data block to the other regions in the programmable data storage device. In an embodiment, the data storage controller performs error correction of the partially decoded composite data block using one or more of the error correction bits in the partially decoded composite data block. The data storage controller deletes the error correction bits of the partially decoded composite data block on completion of error correction, prior to writing the partially decoded composite data block to the other regions in the programmable data storage device. In an embodiment, the data storage controller generates and adds one or more distinct error correction bits to the partially decoded composite data block and writes the partially decoded composite data block with the distinct error correction bits to the other regions in the programmable data storage device based on weights assigned to the other regions in the programmable data storage device.

In an embodiment, the data storage controller transmits the partially decoded composite data block to one or more other data storage controllers in communication with the data storage controller via a network. The other data storage controllers write the received partially decoded composite data block to one or more of multiple regions in their associated programmable data storage devices.

The method and system disclosed herein increases both data retention and the number of times each page in a programmable data storage device can be programmed, without adding to the cost of storage in the programmable data storage device.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and components disclosed herein.

FIG. 9 exemplarily illustrates an input data block to be configured for storage in a programmable data storage device using the method disclosed herein.

FIG. 10 exemplarily illustrates a data block obtained by merging residual sub data blocks obtained by performing run length encoding according to the method disclosed herein.

DETAILED DESCRIPTION OF THE INVENTION

Figure 1:
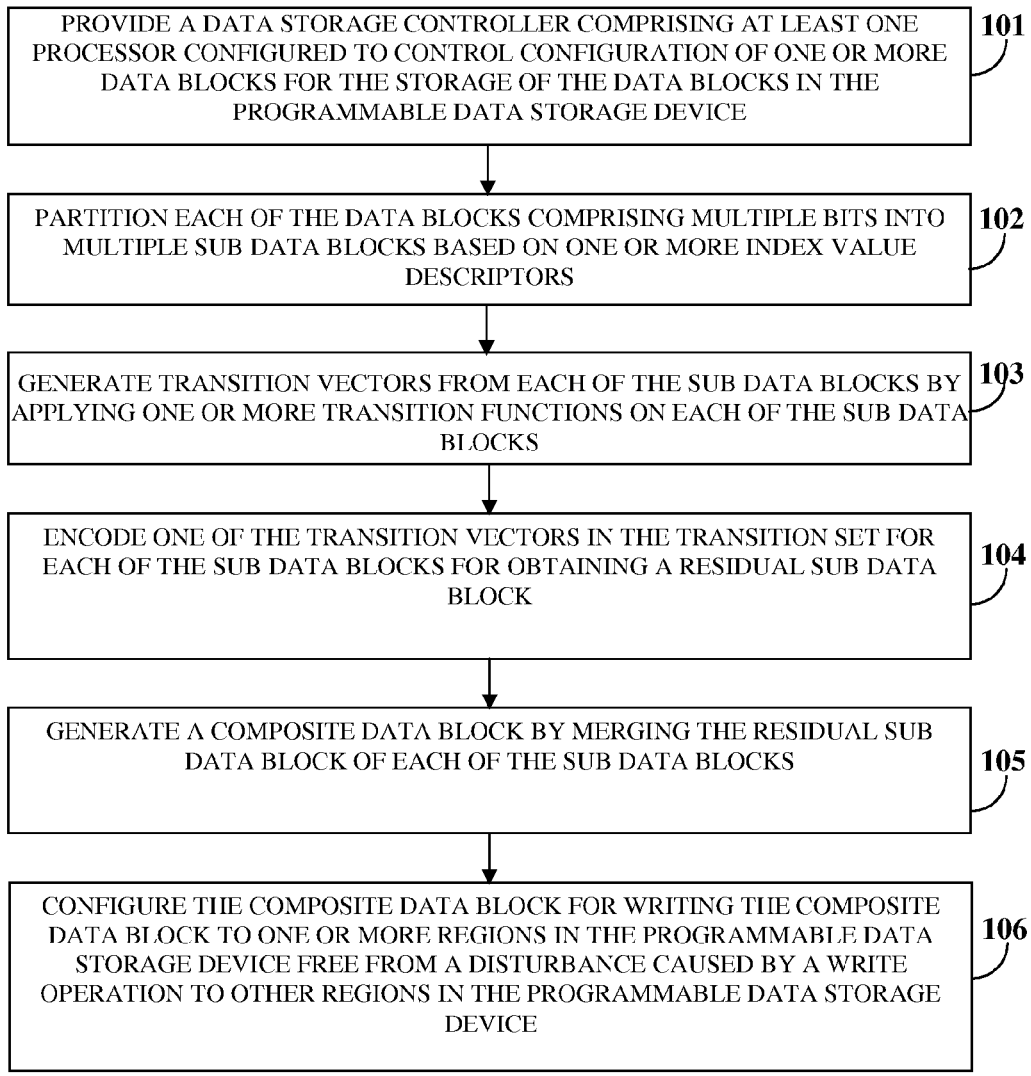
FIG. 1 illustrates a method for managing storage of one or more data blocks in a programmable data storage device.

FIG. 1 illustrates a method for managing storage of one or more data blocks in a programmable data storage device, for example, a flash memory device. The method disclosed herein provides 101 a data storage controller comprising at least one processor configured to control configuration of one or more data blocks for the storage of the data blocks in the programmable data storage device. The data storage controller is, for example, a microcontroller device such as a flash memory controller configured to program the programmable data storage device. In an embodiment, the data storage controller resides inside the programmable data storage device to support movement of pages. The data storage controller partitions 102 each of the data blocks comprising multiple bits into multiple sub data blocks based on one or more index value descriptors. Each of the sub data blocks comprises a distinct sequence of a number of bits. As used herein, the term "index value descriptor" refers to a function that defines a sequence of numbers that determines the order of arrangement of bits extracted from a data block for generating new bit streams for the sub data blocks from the original bit stream of the data block. Each of the numbers is referred to as an index. Each sequence of numbers that determine the order of arrangement of the bits for the sub data blocks is herein referred to as an "index map". A collection of index maps defined by an index value descriptor is herein referred to as "index map set". In an embodiment, the data storage controller is used on smaller partitions of data blocks in multiple iterations to reduce the implementation gate count.

Each index value descriptor defines a particular pattern of partitioning of the data block into sub data blocks. The index value descriptor generates indices, for example, based on prime numbers, consecutive numbers, pseudorandom binary sequence (PRBS) numbers based on tap points, etc. The indices determine the arrangement of bits from the data block for each of the sub data blocks. Furthermore, in an example, the index value descriptor does not specify all the indices. The data storage controller constructs another sub data block from all the unspecified indices. The index value descriptors reduce the memory space required to store the index maps. The sequence of numbers defined as part of an index map by an index value descriptor is smaller than or equal to the number of bits on which the index value descriptor is applied. The index value descriptors are stored in a lookup table and establish a mapping between the arrangement of bits in the data block and the resultant sub data blocks obtained by partitioning the data block. Each index map is referenced using a sequence number of the index map in the index map set. Furthermore, the data storage controller defines a set of index value descriptors for a data block. The data storage controller selects the index value descriptor based on a prior knowledge about the data block, for example, by determining that the data block is from a moving picture experts group-4 (MPEG-4) file, or selects an arbitrary index value descriptor to initiate partitioning of the data blocks.

In an embodiment, the data storage controller generates index maps for subsequent iterations based on transformations associated with the data block and sub data blocks in a previous iteration. For example, the data storage controller determines that if transition vectors generated for corresponding sub data blocks of a particular data block were encoded in a previous iteration using run length encoding (RLE) of base 2, then the number of sub data blocks is large and consequently, the number of transition vectors in the transition set for the next iteration is larger. The data storage controller checks whether a particular combination of an index map and a transition set comprising the transition vectors enables optimal reorganization of a data block, for example, a moving picture experts group-4 (MPEG-4) data block. If the data storage controller determines that the selected combination of an index map and a transition set does not provide optimal reorganization of a data block, then the data storage controller excludes the combination of that index map and the transition set for subsequent iterations of processing of that data block. In an example, the data storage controller first executes a PRBS based index map for rearranging the bits of the data block before initiating processing on the MPEG-4 data block. The data storage controller generates a sequence of a number of bits in each of the sub data blocks based on the index value descriptors. The data storage controller constructs the sub data blocks such that the sub data blocks are a subset of the original data block and the sequence of bits is determined by the index map.

Consider an example where the data storage controller uses an index map set of length 32, that is, the data storage controller uses 32 index maps. The data storage controller generates a set of unique index maps defined, for example, as an array of prime numbers by an index value descriptor. Therefore, each of the index maps is associated with a corresponding prime number. For an index map "i" in the index map set, the data storage controller extracts a prime number "p" as:

$$p=\text{prime\_number}[i].\qquad\text{Equation (1)}$$

The prime numbers are stored sequentially in order in an array, that is, as 2, 3, 5, 7, etc. Therefore, the data storage controller determines prime_number[0] as 2, prime_number[1] as 3, etc. The length of the array of prime numbers is determined by the length of the index map set. Since the length of the index map set is 32, the data storage controller uses 32 prime numbers for generating 32 possible combinations of partitioning the data block into sub blocks. In this example, the data storage controller first partitions the data block into two sub data blocks. The data storage controller determines a first index map as:

$$n_0=p\qquad\text{Equation (2)}$$

For each of the subsequent index maps denoted by $n_i$ in the index map set, the index map is obtained iteratively as follows:

$$\text{for } (i=1; i<N/2; i++) = n_i = (n_{(i-1)}+p)\text{ modulo } N,\qquad\text{Equation (3)}$$

where "i" denotes a particular index map, and N denotes the total bit length of the data block. Therefore, each subsequent index map is based on the preceding index map translated by the corresponding prime number and modulo bound by the total number of bits in the data block.

While traversing N/2 bits, the data storage controller tracks the data block as an N bit array. In order to obtain the second data block, the data storage controller generates the complementary N/2 array by complementing the bits from the array generated by Equation (3). In an example, a sub data block resulting from the application of an index value descriptor to a 16 bit data block is exemplarily illustrated in FIG. 5. In another example, the data storage controller uses a pseudo-random binary sequence (PRBS) generator to define the index value descriptors for generating the index maps. The data storage controller generates a PRBS based index value descriptor in order to arrange the bits of the data block more uniformly when one bits herein referred to as "ones" and zero bits herein referred to as "zeros" in a sub data block appear together. This, for example, allows the data storage controller to perform run length encoding (RLE) encoding using a fixed base on the sub data block, since the RLE encoding can be performed optimally when the distribution of ones and zeros is nearly uniform.

Furthermore, in an embodiment, the data storage controller creates data redundancy by replicating the bits of each of the data blocks in one or more of the sub data blocks, during partitioning of each of the data blocks. This ensures that even with the possibility of corruption of one of the sub data blocks, the data storage controller can still retrieve the original data block using the bits replicated in the second sub data block. This allows the data storage controller to regenerate the data block by retrieving the replicated bits. In an example, the data storage controller replicates the bits describing the information on the index value descriptor used for obtaining sub data blocks, to each of the sub data blocks. Therefore, in this example, the data storage controller identifies and selects the bits that operate as a signature for partitioning the data block, that is, the data storage controller selects the bits comprising the information on the index value descriptors, for replication in one or more sub data blocks. This enables the recovery of the original data block in the event of corruption of a particular sub data block.

The data storage controller generates 103 transition vectors from each of the sub data blocks by applying one or more transition functions on each of the sub data blocks. The generated transition vectors constitute a transition set for each of the sub data blocks. As used herein, the term "transition vector" refers to a bit stream comprising bits in a sequence, with a low ratio of ones to zeros or zeros to ones, obtained from a bit stream of the sub data block by application of a transition function. One or more of these bit streams have a lowest possible ratio of ones to zeros or zeros to ones. Also, as used herein, the term "transition function" refers to a reversible mathematical transformation that modifies the bit stream of the sub data block to obtain a bit stream with the desired ratio of ones to zeros or zeros to ones. Each transition vector of a transition set provides a different pattern of bits for a sub data block. The data storage controller performs one or more reversible mathematical transformations on the distinct sequence of bits in each of the sub data blocks. The reversible mathematical transformation is, for example, a toggle operation such as an exclusive OR (XOR) operation performed on a sub data block. The subsequent transition vectors are generated, for example, by performing a sequence of shift operations and XOR operations on each of the sub data blocks. Therefore, the transition set comprises a collection of toggle vectors or an inverse of the toggle vectors, where a toggle vector is generated by an XOR operation between the bits in a particular sub data block and the bits of the sub data block shifted by a distance parameter that defines the number of bits to be shifted.

The data storage controller stores all the transition vectors in a memory location that is referenced during selection of one of the transition vectors for encoding of the selected transition vector. In an example, the data storage controller stores 8 transition sets in the memory location, where each transition set comprises 16 transition vectors. The first transition set $T_0$ comprises a collection of transition vectors defined by $\{T_{000}\ T_{002}\ T_{003}\ T_{004}\ T_{005}\ T_{006}\ T_{007}\ T_{008}\ T_{009}\ T_{010}\ T_{011}\ T_{012}\ T_{013}\ T_{014}\ T_{015}\}$. The transition vectors are defined as follows:

$T_{000} = B$, where $B$ is the sub data block.     Equation (4)

The data storage controller iteratively generates each of the subsequent transition vectors in the transition set using the transition function below:

for $(i=01; i<16; i++) = T_{0i} = T_{0i-1}$ XOR SHIFT_LEFT $(T_{0i-1})$     Equation (5)

Therefore, for each transition vector $T_{0i}$, the data storage controller performs an exclusive OR (XOR) operation between a previous transition vector $T_{0i}$ and a logically left shifted version of the previous transition vector $T_{0i-1}$ to generate the transition vector $T_{0i}$. Furthermore, for generating each of the additional transition sets $T_1, T_2, T3, \ldots, T_7$, the data storage controller uses the equation below:

$T_j = B$ XOR SHIFT_LEFT$(B, j+1)$     Equation (6)

where XOR SHIFT_LEFT(B, j+1) is a transition function used to shift a sub data block B by a bit distance "j+1". This generates the first transition vector in the transition set. The data storage controller generates the next 15 transition vectors in the transition set according to equation (5).

The data storage controller stores information on a particular transition set and the consecutive transition vectors in the transition set, for example, in a memory location in the data storage controller. Considering the above example, the data storage controller uses the notation <3 bit group number><4 bit transition vector> where the "group number" refers to the particular transition set to which a transition vector belongs. Therefore, the total number of bits used to encode information on the transition vector is, for example, (3+4) equal to 7 bits.

In an embodiment, the data storage controller selects one of the transition vectors in the transition set based on selection criteria for encoding the selected transition vector. The selection criteria define a cost function for an optimal encoding of a data block. The selection criteria comprise, for example, one of a predetermined ratio of ones to zeros, a lowest number of ones or zeros, a total number of ones lesser than a predetermined threshold, etc. If the data storage controller determines that a transition vector does not have the required ratio of ones to zeros, or zeros to ones, the data storage controller generates new sub data blocks by merging the sub data blocks into groups comprising sub data blocks that meet the selection criteria and the sub data blocks that do not meet the selection criteria. The data storage controller repeats the steps of generating and applying index value descriptors to those sub data blocks that do not meet the selection criteria. In an example, the data storage controller prunes the transition set by selecting transition vectors of the transition set based on an absolute difference in the count of ones and zeros in each transition vector. In another example, the data storage controller prunes the transition set by selecting transition vectors of the transition set with a larger ratio of zeros to ones, and by complementing the ratio of ones to zeros. Therefore, the data storage controller considers all the transition vectors and selects the most desirable pattern of bits to be representative of the sub data block associated with the transition vector, which is used in subsequent encoding steps.

The data storage controller encodes 104 one of the transition vectors in the transition set, that is, the selected transition vector for each of the sub data blocks for obtaining a residual sub data block comprising a reduced number of bits for each of the sub data blocks, resulting in increased bit space for accommodating parity bits and error correction bits. Also, as used herein, the term "bit space" refers to a number of vacant bit positions in a data block. The data storage controller encodes the selected transition vector for each of the sub data blocks, for example, by performing run length encoding (RLE) on the selected transition vector for obtaining the residual sub data block comprising the reduced number of bits for each of the sub data blocks. As used herein, the term "residual sub data block" refers to a sub data block obtained by replacing the original data stream in the selected transition vector with the bit stream having the shortest encode length for the selected transition vector. The data storage controller replaces the bits of each selected transition vector with the encoded bits from the selected transition vector to obtain the residual sub data block. That is, the data storage controller creates the residual sub data block using the bit stream having the shortest encode length obtained by encoding the selected transition vector. The residual sub data block comprises the bits obtained by performing run length encoding on the selected transition vector, the identifiers for the selected index map and the selected transition vector, etc. The residual sub data block further comprises bits used to identify a transformation, for example, an iteration number that identifies a particular iteration of processing.

In an embodiment, the data storage controller parses each of the transition vectors and compares the sequence of bits in each of the transition vectors with predetermined bit patterns. Each of the bit patterns are mapped to an associated encoding string. Therefore, the data storage controller encodes sequences of bits of the selected transition vector that match the predetermined bit patterns according to the associated encoding string, thereby compressing the transition vector and increasing the bit space for obtaining the residual sub data block with increased bit space. The encoding interval of the run length encoding is configured, for example, based on the required ratio of zeros to ones. In an example, the data storage controller first verifies that a transition vector has a fewer number of ones than zeros. The data storage controller performs run length encoding by computing the number of zeros between two ones. If the data storage controller uses a base 2 run length encoding (RLE) then the encoding string "00" corresponds to a scenario where there are no zeros between two ones; the encoding string "01" corresponds to a scenario where there is one zero between two ones; and the encoding string "10" corresponds to a scenario where there are two zeros between two ones. The encoding string "11" corresponds to a scenario where there are more than two zeros between two ones in which case the data storage controller analyzes the next two bits as well to determine the numbers of zeros between two ones. When the data storage controller uses base 3 RLE, the data storage controller uses 3 bits to represent the number of zeros between two ones. The encoding string "000" represents no zeros and the encoding string "111" represents more than 6 zeros between two ones in which case the data storage controller checks the next 3 bits as well to determine the number of zeros between two ones.

In an embodiment, the data storage controller generates distinct index value descriptors for partitioning each of the sub data blocks for enabling an optimal performance of encoding of one of the transition vectors, that is, the selected transition vector for each of the sub data blocks. This step improves the ratio of zeros to ones for some of the sub data blocks. Furthermore, the data storage controller partitions the sub data blocks to further reduce the number of bits on which the data storage controller performs run length encoding (RLE). This is useful, for example, when the data storage controller needs to reduce the number of bits in the resulting composite data block by only a few bits for a given iteration. Furthermore, the data storage controller also performs partitioning of the sub data blocks to improve the efficiency of RLE, since the number of bits saved by further encoding the transition vectors associated with the resulting sub data blocks can be greater than encoding the transition vector associated with the original sub data block.

In an embodiment, the data storage controller partitions all the sub data blocks subsequent to generation of the transition vectors using a set of distinct index value descriptors, generates transition vectors from each of the resulting sub data blocks, and performs run length encoding (RLE) on one of the generated transition vectors selected based on the selection criteria. In an example, the data storage controller generates an index map set comprising multiple index maps according to a selected index value descriptor. The data storage controller performs partitioning of the sub data blocks based on the index maps in the index map set and generates transition vectors from each of the resulting sub data blocks. The data storage controller encodes one of the generated transition vectors for each of the resulting sub data blocks using RLE for obtaining the residual sub data block. The data storage controller checks the increase in bit space achieved in each residual sub data block using RLE. If the data storage controller determines that there is no substantial increase in the bit space when compared to the bit space in the original transition vector, the data storage controller does not encode information on the index map along with the encoding information of the original transition vector, and discards the index map used for partitioning the sub data blocks.

The data storage controller generates 105 a composite data block by merging the residual sub data block of each of the sub data blocks. As used herein, the term "composite data block" refers to a data block obtained by combining one or more residual sub data blocks. The composite data block comprises the increased bit space provided by each residual sub data block. The data storage controller generates and adds one or more parity bits and error correction bits, for example, error correcting code (ECC) bits to the composite data block for enabling alignment and error correction of the composite data block. Furthermore, the generation of the parity bits helps maintain the integrity of the encoded words, and adds to the integrity of the page data programmed based on the composite data block in the programmable data storage device.

The number of parity bits and/or the error correcting code (ECC) bits added to the composite data block depends on the bit space available after encoding of the transition vectors generated from the sub data blocks in multiple iterations, and the column weights associated with a page to which the composite data block needs to be written in the programmable data storage device. The number of ECC bits is also adapted to match, for example, an expected error rate, a required retention time for a particular page, etc.

The data storage controller inserts information on the encoding of the selected index map, the selected transition vector and the associated transition set, the RLE encoded sequence, etc., to the composite data block. The data storage controller appends, for example, information on a sequence number of the index map in the index map set stored in a memory location of the data storage controller, the index value descriptor stored in the lookup table, the sequence number of the selected transition vector stored in the memory location, the sequence number of the transition function stored in the lookup table, etc., to the composite data block. This information enables decoding of the composite data block for retrieving the original data block. The encoded information can be included either as a prefix or a suffix to the composite data block.

In an embodiment, the data storage controller distributes the generated parity bits and error correction bits in the increased bit space of the composite data block over the length of the composite data block. The distribution of the parity bits and the error correction bits through the length of the composite data block results in a reduction in burst errors. Consider an example where the composite data block is vulnerable to a burst error introduced by the cells of the programmable data storage device. Since the error correction bits are distributed through the length of the composite data block, the data storage controller recovers at least some of the error correction bits that are unaffected by the burst error from the composite data block. The data storage controller further uses the recovered error correction bits to perform error correction on the composite data block and recover the original data block.

In an embodiment, the data storage controller replicates one or more bits of the composite data block to one or more memory locations in the data storage controller for creating data redundancy. These bits comprise, for example, one or more bits of the encoded transition vector in the composite data block. In an embodiment, the data storage controller adds parity bits, error correction bits, etc., to the composite data block and replicates the composite data block along with the parity bits, error correction bits, etc., in the following iteration. The bits comprise a subset of the encoding bits in the composite data block. In an example, the data storage controller replicates bits needed for decoding the composite data block to recover the original data block, for example, the bits representing the sequence of operations performed by the data storage controller to generate the composite data block. The data redundancy ensures that the bits considered essential for recovering the original data block are accessible from at least one memory location.

The data storage controller configures 106 the composite data block for writing the composite data block to one or more of multiple regions in the programmable data storage device free from a disturbance caused, for example, by a write operation of the same composite data block or another data block to other regions in the programmable data storage device. A "region" in a programmable data storage device, for example, a flash memory device, is, for example, a memory column associated with the architecture of the programmable data storage device. Also, as used herein, the term "disturbance" refers to a corruption of bits stored by a programmable cell or an unintended programming of bits on a programmable cell in a particular region in the programmable data storage device resulting from programming of a neighboring region. Furthermore, storing the composite data block on the programmable data storage device by the data storage controller requires fewer cells to be programmed than storing the original data block.

The configuration of the composite data block for writing of the composite data block to one or more regions in the programmable data storage device comprises arranging bits of the composite data block according to weights assigned to the regions in the programmable data storage device. In an embodiment, the method disclosed herein assigns weights to one or more regions in the programmable data storage device for distinctly identifying regions free from disturbance. The method disclosed herein, for example, provides a weight assignment module external to the data storage controller for assigning the weights to the regions in the programmable data storage device. The weight assignment module is, for example, in electronic communication with the data storage controller. In an embodiment, the weight assignment module is a part of firmware of the data storage controller. In an embodiment, the weight assignment module dynamically generates and assigns the weights to one or more regions in the programmable data storage device, for example, based on one or more of a location of one or more regions in the programmable data storage device, for example, columns of the flash memory, an organization of programmable cells in the regions, a number of prior write operations performed on the regions, a number of times of movement of bits associated with the regions in the programmable data storage device, etc. Furthermore, the weight assignment module assigns the weights, for example, based on memory specifications, number of reads/writes to a particular page, and the retention versus latency requirement associated with a particular write operation. Therefore, the weights distinctly identify one or more regions free from disturbance. In an example, the weight assignment module assigns adjacent columns with mutually exclusive column weights. That is, for every column assigned a weight of 1, the succeeding column is assigned a weight of 0, and vice versa.

In an embodiment, the data storage controller distributes the error correction bits, that is, the error correcting code (ECC) bits to one or more regions in the programmable data storage device based on distinct index value descriptors for reducing burst errors. In an embodiment, the data storage controller dynamically generates one or more distinct index value descriptors based on weights assigned to the regions in the programmable data storage device for collating bits of the composite data block and generating, for example, a modified composite data block. The data storage controller generates the index value descriptors dynamically since the available bit space changes based on each data block written to a page. This means that the number of bits to be programmed to the regions, that is, the columns of the programmable data storage device is not fixed.

Furthermore, the data storage controller dynamically generates index value descriptors that define index maps according to the weights assigned to one or more regions in the programmable data storage device, for example, the column weights. The index maps define the distribution of the error correction bits and/or the parity bits through the regions in the programmable data storage device according to the column weights. The index value descriptors define index maps that arrange the bits of the composite data block to ensure the assignment of the error correcting code (ECC) bits and/or the parity bits to columns with the largest weight, for example, columns associated with a weight of one. The column weights define the selected columns, for example, those columns that are less vulnerable to disturbance, to be programmed for a particular page. In an example, the data storage controller assigns a larger weight to the selected columns. Therefore, if the data storage controller determines that the number of bits to be stored in the programmable data storage device is lower than the number of columns assigned with larger weights, then the data storage controller uses only the columns assigned with larger weights for performing the write operation. If the data storage controller determines that the number of columns assigned with larger weights is less than the number of bits from the composite data block to be written to the programmable data storage device, that is, the total number of bits obtained after adding ECC and/or parity bits to the composite data block, the data storage controller assigns the ECC and/or parity bits with a greater preference than the other bits of the composite data block, for writing to the columns with larger weights. When the number of columns assigned with larger weights is greater than the number of bits in the composite data block, the data storage controller toggles the bits of the composite data block and writes the toggled bits to the unfilled columns. Therefore, the larger column weights instruct the data storage controller to program specific columns of a particular page in the programmable data storage device.

The data storage controller accesses the weights assigned to each of the regions, for example, the weights assigned to the columns for each row by the weight assignment module for overcoming the disturbance caused by the write operation. During the programming of the composite data block to a row on the programmable data storage device, the data storage controller analyzes the weights assigned to each of the columns associated with that row and writes the bits of the composite data block into the columns with a lower weight less often. This reduces the effect of the disturbance caused by the write operation to other regions in the programmable data storage device.

The data storage controller aligns the composite data block based on the weights assigned to the regions in the programmable data storage device, for example, based on the weights assigned to the columns to be written. The data storage controller generates and adds one or more parity bits to the composite data block for storing the aligned composite data block in the programmable data storage device. Furthermore, the data storage controller fills the composite data block with zeros to match the selected columns. For example, the data storage controller fills the composite data block with zeros to arrange the bits to match the columns assigned with larger weights. That is, the data storage controller assigns a greater preference to columns with larger weights for writing to the programmable data storage device. If the data storage controller determines that the composite data block has a lower number of bits than the number of columns assigned with larger weights, then the data storage controller sets additional zeros to program the selected columns. The data storage controller thereby manages storage of the data blocks in the programmable data storage device by organizing the data blocks for each write operation to particular regions in the programmable data storage device and reducing disturbance from write operations to other regions in the programmable data storage device without increasing the storage size of the programmable data storage device.

The data storage controller minimizes the number of data blocks that go through program erase cycles for each write operation, while minimizing the effect of disturbance caused during programming of the regions, for example, the columns in the programmable data storage device, by a write operation to other columns in the programmable data storage device. The distribution of programmable cells is controlled across multiple write operations to a page of the programmable data storage device using column weights that change along with the write count, that is, the number of write operations to a location in the programmable data storage device, for the composite data block. The weights assigned to a column of a programmable cell are configured to cluster the programmable cells to specific locations of the page. To uniformly use the available cells in a page, weights are moved after each page is erased. In an embodiment, the weights assigned to a column are modified based on the number of previous write operations associated with the pages that are programmed with the composite data block. The encoded data blocks are aligned with the column weights after the iterations. The alignment is used to calculate the number of additional parity bits that are to be added to the composite data block.

In an embodiment, the data storage controller skips or masks adjacent regions that are programmable on the programmable data storage device for writing the composite data block to one or more regions in the programmable data storage device free from disturbance caused by a write operation to other regions in the programmable data storage device. For example, the clustering effect around weighted columns can be used to reduce the program time for a page by masking regions. Moreover, skipping continuous columns of a page by the data storage controller reduces the write time or program time. Furthermore, in an embodiment that enables faster data recovery, the data storage controller writes the error correcting code (ECC) bits to separate locations equipped to hold ECC bits to correct bit errors in a page of the programmable data storage device. In an embodiment, the data storage controller uses, for example, low density parity check (LDPC) codes for error correction without additional bit space overhead. Therefore, in the method disclosed herein, the location and number of parity bits are determined in conjunction with the operations of the data storage controller to reduce the number of programmed cells and skew the programmed cells resulting in an increase of the number of parity bits that are included in the composite data block.

In an embodiment, the data storage controller copies the composite data block written to one or more regions in the programmable data storage device to other regions in the programmable data storage device. A decode of the data storage controller partially decodes the composite data block written to one or more regions in the programmable data storage device based on the dynamically generated distinct index value descriptors. For example, when the composite data block is moved between pages in the same programmable data storage device or between different programmable data storage devices, the decoder performs only a partial decode of the written composite data block. In order to generate the partially decoded composite data block, the data storage controller reverses only some of the steps of encoding of the composite data block. The data storage controller, for example, retrieves the composite data block from a modified composite data block, by reversing the step of generating the index maps based on the column weights. The data storage controller removes the column weights because different pages have different column weights. In an embodiment, the data storage controller accesses the column weights stored in a lookup table for performing the partial decoding of the composite data block. Therefore, the data storage controller enables the copying of the composite data block across locations in the programmable data storage device without completely decoding the composite data block. The data storage controller then writes the partially decoded composite data block to other regions in the programmable data storage device.

In an embodiment, the data storage controller performs error correction of the partially decoded composite data block using one or more of the error correction bits in the partially decoded composite data block. The data storage controller deletes one or more of the error correction bits of the partially decoded composite data block on completion of the error correction, prior to writing the partially decoded composite data block to the other regions in the programmable data storage device. This reduces the bandwidth required for copying the composite data block to other regions in the programmable data storage device. Furthermore, the data storage controller provides separate error protection for every copy of the composite data block to other regions in the programmable data storage device, or transmission of the composite data block to other data storage controllers that configure composite data blocks for writing to their associated programmable data storage devices. The data storage controller generates and adds one or more distinct error correction bits to the partially decoded composite data block and writes the composite data block with the distinct error correction bits to the other regions in the programmable data storage device based on weights assigned to the other regions in the programmable data storage device.

In an embodiment, the data storage controller transmits the partially decoded composite data block to one or more other data storage controllers in communication with the data storage controller via a network. The network is, for example, a local area network, a communication network implementing WiFi® of the Wireless Ethernet Compatibility Alliance, Inc., a Bluetooth® communication network, a wireless universal serial bus (USB) communication network, etc. The other data storage controllers write the received partially decoded composite data block to one or more regions in their associated programmable data storage devices. In an application of the method disclosed herein, the composite data block can be transmitted across different storage devices to reduce the memory wear on the storage device to which the composite data block is copied. The receiving programmable data storage device can, for example, further iteratively process this composite data block to reduce errors and improve error recovery.

The data storage controller performs the partitioning of the data blocks to sub data blocks, generation of the transition vectors, and encoding of the selected transition vectors recursively during each successful copy or write operation for each of the data blocks. The data storage controller performs multiple iterations of each of these steps after generating the composite data block with the encoded bits and the associated parity bits and error correction bits to create larger bit spaces for alignment, error correction, etc.

The data storage controller decodes the composite data block to obtain the original data block using the information on the selected index maps, the selected transition vector, the RLE encode sequence, etc. The data storage controller recovers the errors in the data of the composite data block by performing error correction using the error correcting code (ECC) bits. The data storage controller performs a reversible mathematical transformation on the transition vector to retrieve the data of the original sub data block, expands each of the sub data blocks based on the index maps, and merges the sub data blocks to retrieve the original data block as disclosed in the detailed description of FIG. 8.

The data storage controller can be used in different ways over the life cycle of the programmable data storage device. When the programmable data storage device is new, that is, the data storage controller writes into most of the columns, the data storage controller cycles through a number of programmable cells to improve write speed. As the number of writes to a page in the programmable data storage device increases, the data storage controller adapts the programming of the cells in order to write fewer bits, and to skew the redundant bits inside a page. If one or more columns have developed an error, the data storage controller excludes the columns from the write operations without compromising data.

Figure 2A:
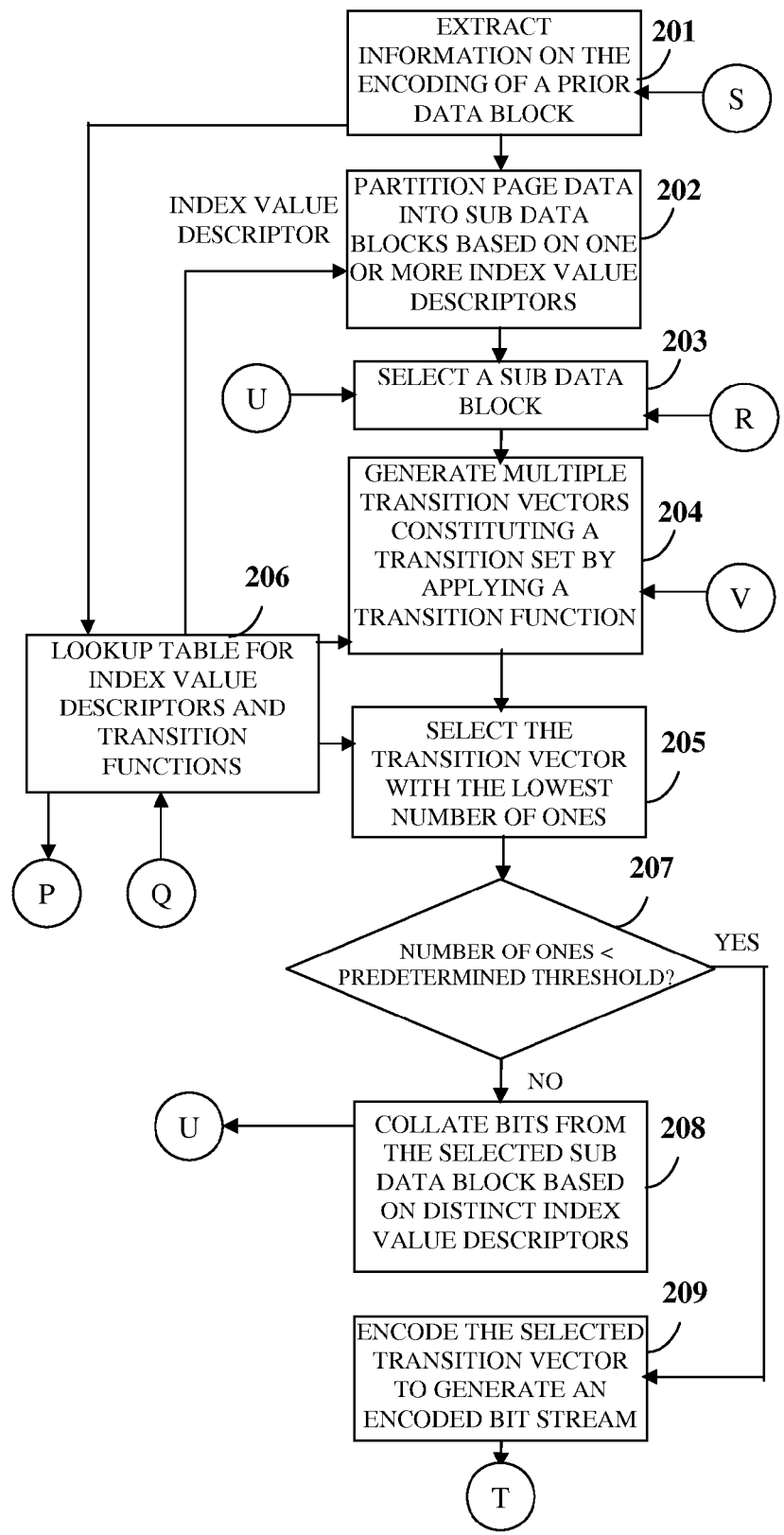
FIGS. 2A-2B exemplarily illustrate a flowchart comprising the steps for managing storage of one or more data blocks in a programmable data storage device using a data storage controller.
Figure 2B:
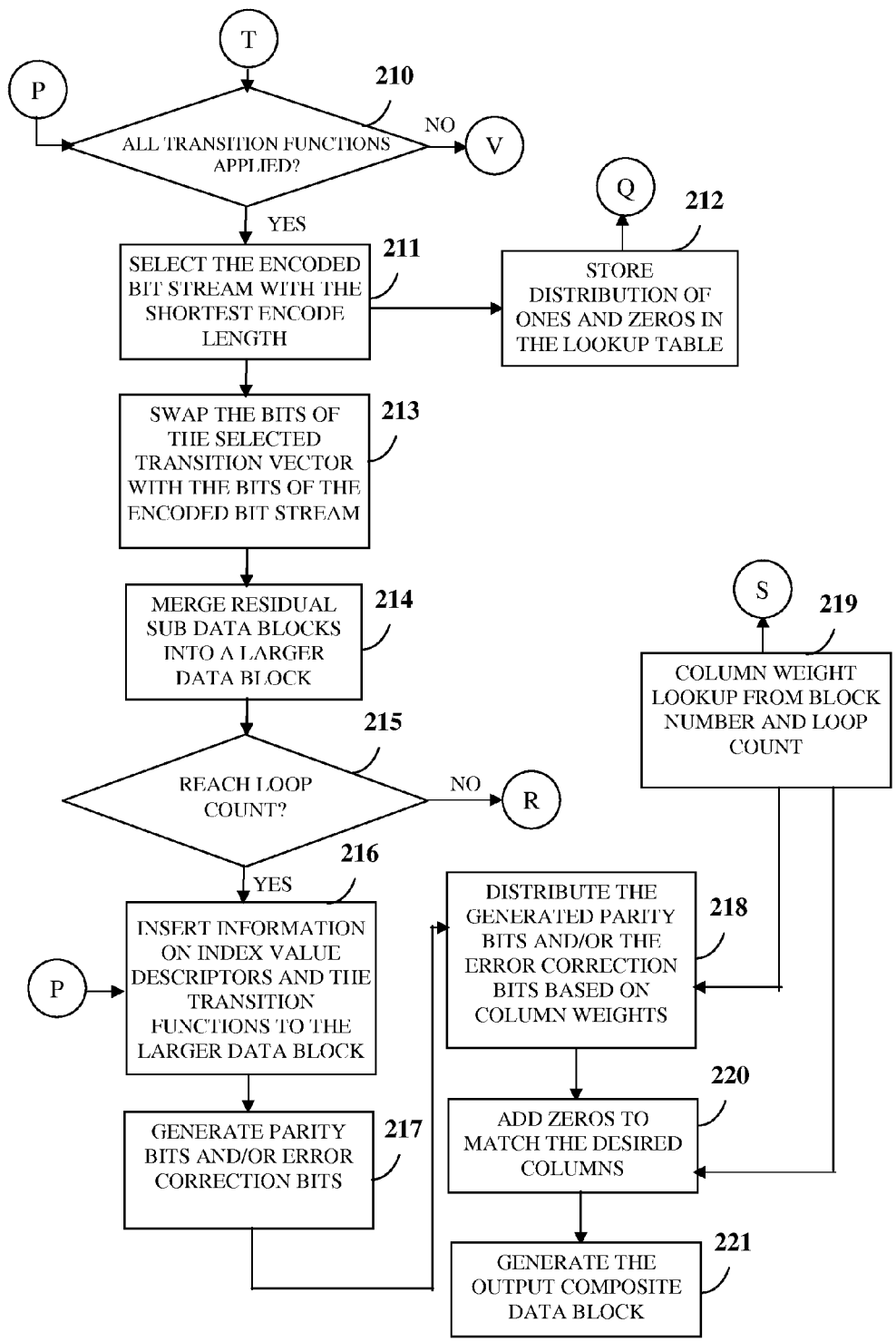

FIGS. 2A-2B exemplarily illustrate a flowchart comprising the steps for managing storage of one or more data blocks in a programmable data storage device using a data storage controller. The data storage controller extracts 201 information on the encoding of a prior data block. The data storage controller analyzes this information to obtain the sequence number of the most recently used index map, the individual weights used for programming the memory columns, the block number and location, etc., of the previous composite data block. The data storage controller then accesses the lookup table 206 to extract index value descriptors. The data storage controller partitions 202 the page data into sub data blocks based on one or more index value descriptors and generates a sequence of bits based on the index value descriptors. The data storage controller selects 203 a sub data block. The data storage controller then generates 204 multiple transition vectors constituting a transition set by applying a transition function on the selected sub data block.

The data storage controller generates the transition vectors based on a set of transition functions. In this example, the data storage controller performs an exclusive OR (XOR) operation on each of the sub data blocks to obtain a respective first transition vector. The data storage controller then generates consecutive transition vectors for each of the sub data blocks, for example, using equation (5) as disclosed in the detailed description of FIG. 1. The data storage controller stores each of the resultant transition vectors for each of the sub data blocks in a memory location, thereby compiling a list of possible bit sequences that can be encoded. The data storage controller then accesses the memory location and selects 205 the transition vector with the lowest number of one bits, herein referred to as "ones". The data storage controller checks 207 whether the number of ones in the selected transition vector is less than a predetermined threshold of a number of ones for a particular length of a data block. If the number of ones in the selected transition vector is lesser than the predetermined threshold, the data storage controller proceeds to encode 209 the selected transition vector to generate an encoded bit stream. In this example, the data storage controller performs RLE encoding on the selected transition vector. If the data storage controller determines that the number of ones in the selected transition vector is greater than the predetermined threshold, the data storage controller collates bits from the selected sub data block based on distinct index value descriptors. The data storage controller accesses the lookup table 206 for distinct index value descriptors based on which the data storage controller collates 208 bits from the selected sub data block and performs further partitioning of the selected sub data block. The data storage controller further selects 203 one of the resulting sub data blocks and generates 204 multiple transition vectors constituting a transition set by applying a transition function to the selected sub data block. Furthermore, the data storage controller continues to reorganize each of the sub data blocks before every write operation to the programmable data storage device for a predetermined number of iterations. The data storage controller sets the number of iterations based on the latency tolerance of the write operation. For example, since a wear leveling write operation is configured with a tolerance to a greater latency, the data storage controller sets a greater number of iterations when using wear leveling.

After encoding each selected transition vector to generate an encoded bit stream, the data storage controller checks 210 whether all the transition functions defined for a data block have been applied by accessing the lookup table 206. If all the transition functions have been applied to each sub data block, the data storage controller collects all the encoded bit streams generated from the encoding of the transition vectors. If all the transition functions defined for a data block have not been applied, the data storage controller applies the transition functions accessed from the lookup table 206 to generate 204 transition vectors and repeats the steps 205, 207, 208, and 209 for generating corresponding encoded bit streams.

The data storage controller considers the encoded bit streams obtained for the transition functions and selects 211 the encoded bit stream with the shortest encode length. The data storage controller stores 212 the distribution of ones and zeros defining the encoded bit stream in the lookup table 206. The data storage controller swaps 213 the bits of the corresponding selected transition vector with the bits of the encoded bit stream, thereby generating a residual sub data block. Since the total number of bits in the encoded bit stream is lesser than the total number of bits in the selected transition vector, the bit space for accommodating parity bits and error correction bits is increased. The data storage controller then merges 214 the residual sub data block collected from the particular sub data block into a larger data block. The larger data block is stored in a memory location. The data storage controller checks 215 whether the loop count for the number of sub data blocks has been reached. If the loop count for the number of sub data blocks is not reached, then the data storage controller proceeds to the step 203 and repeats the process until the loop count for the number of sub data blocks is reached. If the loop count for the number of sub data blocks is reached, the data storage controller retrieves the larger data block from the memory location and inserts 216 information on the index value descriptors and the transition functions to the larger data block. The data storage controller generates 217 parity bits and/or error correction bits for the resultant data block. The data storage controller distributes 218 the generated parity bits and/or the error correction bits based on the column weights through the length of the resultant data block by accessing 215 the column weight lookup 219 table from the block number and the loop count. The data storage controller adds 220 zeros to match the desired columns, for example, those columns in the programmable data storage device which have been assigned weights but have not been programmed, and generates 221 the output composite data block.

Figure 3:
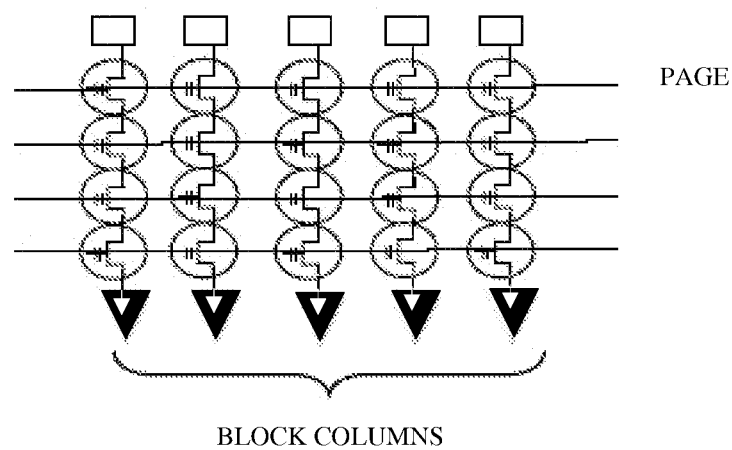
FIG. 3 exemplarily illustrates a data storage array with floating gates in a programmable data storage device.
Figure 4:
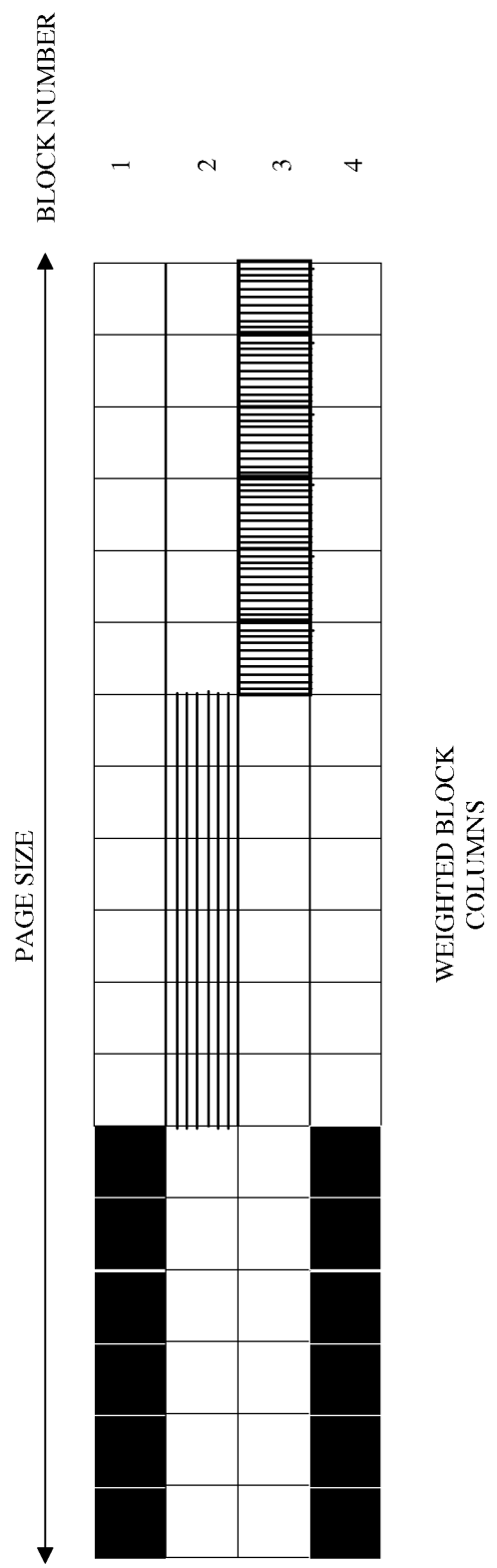
FIGS. 4-7 exemplarily illustrate an encode flow for data blocks to be stored in the programmable data storage device using the data storage controller.

FIG. 3 exemplarily illustrates a data storage array with floating gates in a programmable data storage device. The data storage array of the programmable data storage device comprises pages having one or more rows and one or more columns. The data storage controller disclosed in the detailed description of FIG. 1 manages storage of one or more data blocks in the rows and the columns of the data storage array in the programmable data storage device.

FIGS. 4-7 exemplarily illustrate an encode flow for data blocks to be stored in the programmable data storage device using the data storage controller. A single page of data spans all columns of a memory block as exemplarily illustrated in FIG. 4. A page write populates the selected row. For a single level cell (SLC), every "0" requires a cell to be programmed, while a "1" leaves the cell in its erased state. To limit the number of programmed cells for an SLC column, the data in the cell is required to be transformed to hold mostly bits with the value 1. For a multi-level cell, a group of bits with the value 1 is required to leave a cell in an erased state. To limit the cells programmed, bits with the value 1 are required in adjacent bits. The number of adjacent bits is the number of levels in the multi-level cell (MLC) in the programmable data storage device. To overcome the disturbance caused by a write operation to other regions in the programmable data storage device, the weight assignment module disclosed in the detailed description of FIG. 1 assigns each of the columns with a weight for each page. The weight assignment module marks the columns in which no programmed cells are desired with a value 0 or a low weight. The columns on which programmed cells are desired are marked with a value 1 or a large weight. The column weights along with MLC level are the inputs used to reformat the write data. As exemplarily illustrated in FIG. 4, the shaded portions represent the columns carrying a higher weight. Furthermore, each of the columns is assigned with different weights for different pages.

Figure 5:
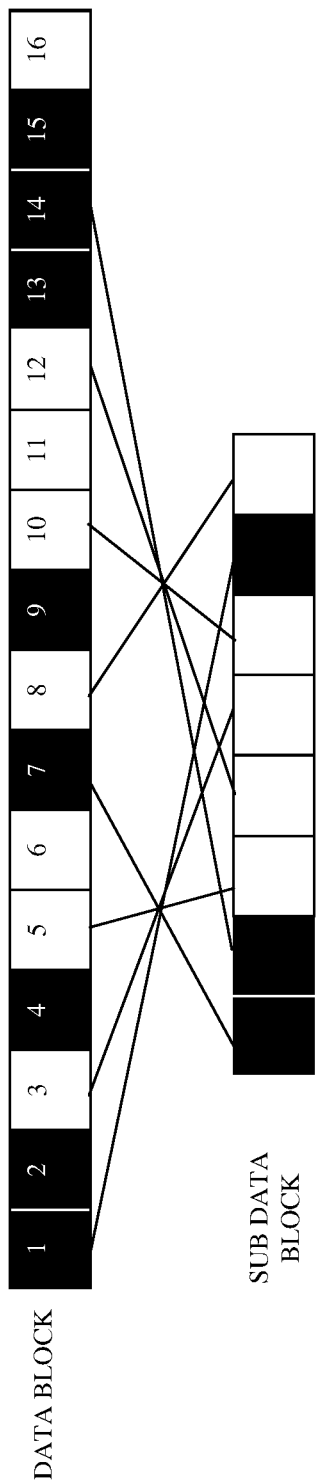
Figure 6:
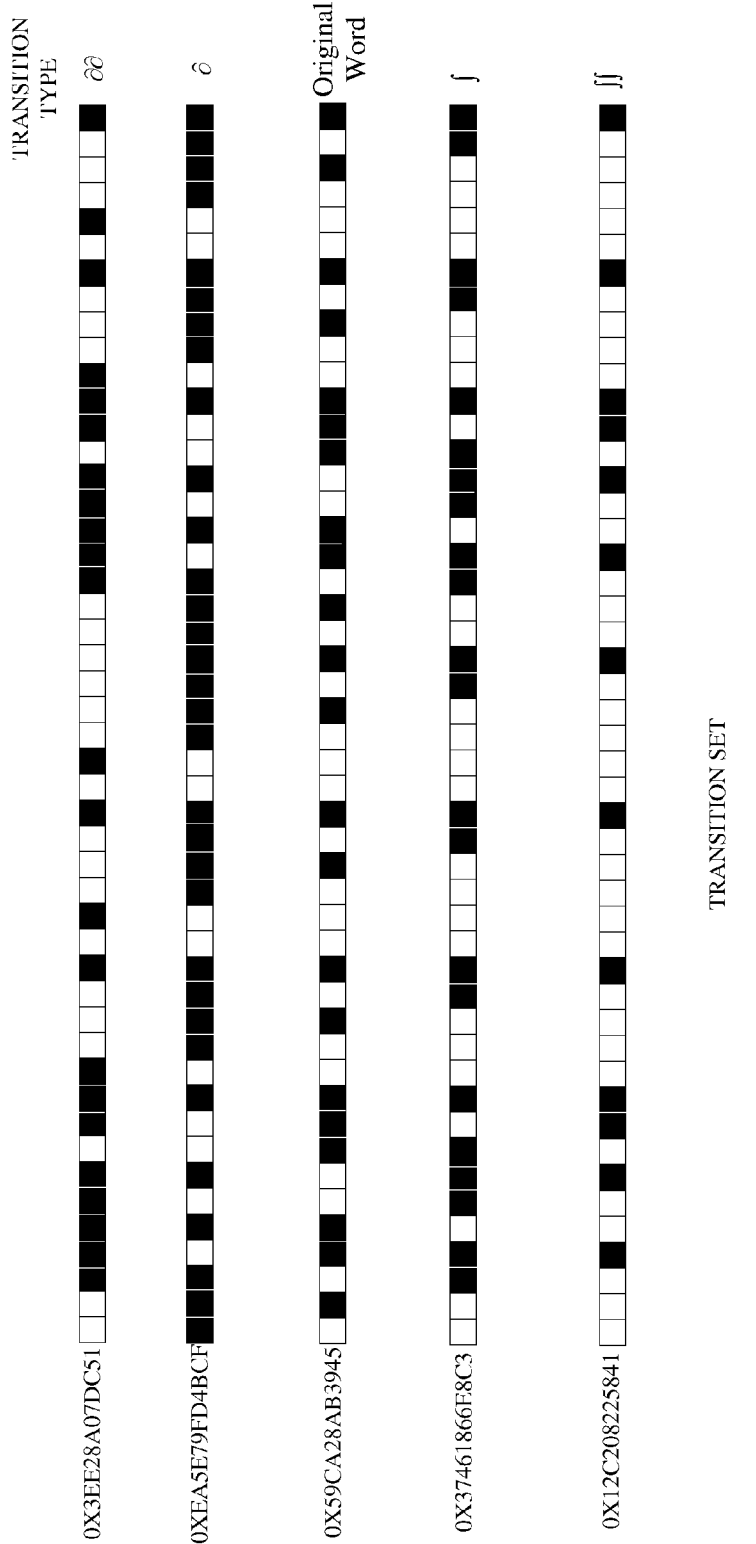

The data blocks are encoded as disclosed in the detailed description of FIGS. 2A-2B. The encoded data block has fewer programmed cells and the cells are skewed based on the weights assigned to each column. Decoding the data blocks is disclosed in the detailed description of FIG. 8. If a data block is being written back into the programmable data storage device to change location, then the data block goes through the encode flow again instead of the decode flow. The encode flow uses an index map as exemplarily illustrated in FIG. 5 to gather a subset of bits from the data block. The indices are used to create a new bit stream for the sub data block from the original bit stream of the data block. The shaded portions in FIG. 5 represent the value 1. All the bits from the original bit stream of the data block are mapped into one more sub data blocks for allowing the data storage controller to recreate the original bit stream. The index value descriptor defines an index map with the sequence of numbers [7, 14, 5, 12, 3, 10, 1, 8] to partition the 16-bit data block. A resultant 8-bit sub data block is exemplarily illustrated in FIG. 5.

The data storage controller uses the sequence of bits generated by the index map from a data block as an input to generate a transition set comprising transition vectors for each of the sub data blocks obtained from partitioning the data block. One of the transition sets generated by the data storage controller is exemplarily illustrated in FIG. 6. The transition set comprises transition vectors which are reversible sequences of bits that can be generated from the original bit sequence. The data storage controller uses a number of transition functions to generate the transition vectors. The data storage controller applies a transition function, for example, a toggle $\partial$ of the sequence of bits of a 48-bit sub data block, a toggle of toggle sequence $\partial\partial$ of the sub data block, an inverse toggle $f$ of the original sequence, and an inverse of the inverse toggle sequence $ff$ on the 48-bit sub data block as exemplarily illustrated in FIG. 6, to generate the transition vectors. The transition function $\partial$ is defined as a single step toggle vector ($\partial$) for a bit sequence $b_{(n-1)} \ldots b_0$ as:

$t_0 = b_0$
$t_i = b_i$ XOR $b_{(i-1)}$ for $i=1 \ldots (i-1)$, where XOR denotes an exclusive OR operation between a bit $b_i$ and its preceding bit $b_{(i-1)}$ in the bit sequence.

Consider another example where a transition function $\partial_3$ is generated by:
$t_0 = b_0$
$t_1 = b_1$ $t_2 = b_2$
$t_i = b_i$ XOR $b_{(i-3)}$ for $i=3 \ldots (i-1)$ The transition functions defined above are used to generate the first transition vectors, in each of the transition sets. The rest of the transition vectors in each of the transition sets are obtained by applying a particular transition function iteratively on each of the generated bit sequences starting from the first transition vector for the transition set. For example, the transition vector using the transition function $\partial\partial$ is obtained by applying the transition function $\partial$ twice to the bit sequence of the sub data block. Furthermore, the transition vector using the transition function $\partial\partial\partial$ is obtained by applying the transition function $\partial$ thrice to the bit sequence of the sub data block, the transition vector using the transition function $\partial\partial\partial\partial$ ($\partial^4$) is obtained by applying the transition function $\partial$ four times to the bit sequence of the sub data block, etc.

The inverse toggle ($f$) transition function is generated by:
$i_0 = b_0$
$i_i = b_i$ XOR $b_{(i-1)}$ XOR $i_{(i-1)}$ for $i=1 \ldots (i-1)$ The transition vector using the transition function $ff$ ($f^2$) is obtained by applying $f$ twice to the bit sequence.

In each iteration step, the index maps, transition sets, and RLE sequences can change, as long as the change can be inferred from the iteration number or the encoded data blocks included with the page data. The step of encoding the data block results in a reformatting of the data block as exemplarily illustrated in FIG. 7.

Figure 7:
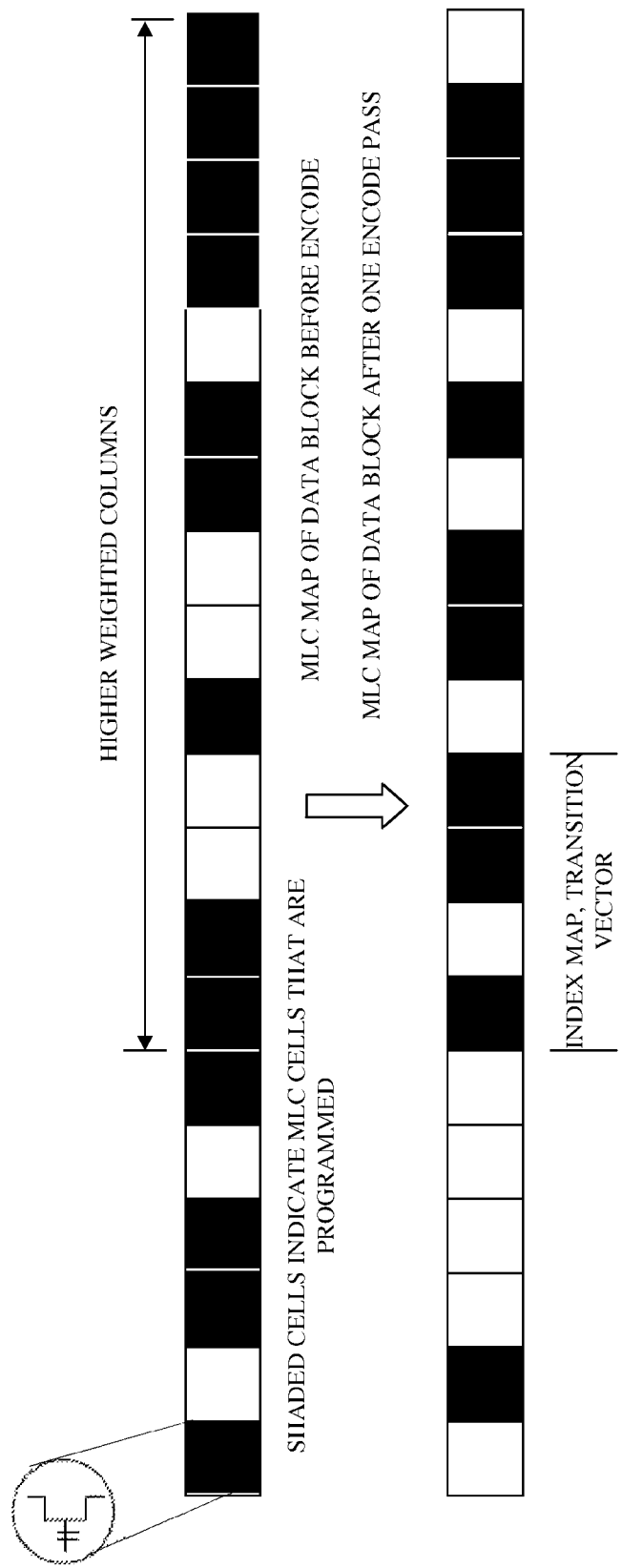

FIG. 7 exemplarily illustrates a multi-level cell (MLC) map of the data block before encoding and the MLC map of the data block after one pass of encoding. The shaded boxes in FIG. 7 indicate the MLC cells that are programmed. As exemplarily illustrated in FIG. 7, a larger number of cells associated with higher weighted columns are programmed after an encode operation. The index value descriptor and the transition set comprising the transition vectors provide a partial description of bit distribution on a page of the data block. A lookup table is built to match the results of previous iterations to the next most likely index value descriptor and transition function. The data storage controller accesses the lookup table to read an index value descriptor and generate index maps, and a likely transition map comprising a set of transition functions to generate the transition vectors at the start of the next iteration. Another lookup table is used to determine the column weights for a page. The column weights depend on the location of a block in the programmable data storage device, the organization of programmable cells in that programmable data storage device, the number of prior writes to that block, and the number of moves associated with the pages in that block.

Furthermore, the data storage controller stores the sequence of operations performed for generating the composite data block, in a separate memory location. Each step of generating the composite data block is defined, for example, by a unique sequence of bits. The data storage controller stores the sequence of operations constituting the encoding of the data block as a fixed size array comprising the sequence of bits representing each of the individual operations. A decoder of the data storage controller references the memory location that stores the sequence of bits representing the steps used for encoding the data block, in order to generate the original data block. Therefore, at the end of an iteration comprising the steps 101, 102, 103, 104, disclosed in the detailed description of FIG. 1, the data storage controller determines whether the increase in the bit space meets a preconfigured target for a required increase in bit space. If the data storage determines that the increase in bit space realized on performing the iteration is sufficient, the data storage controller appends the sequence bits to the encoded data block, that is, the composite data block. In an example, for a particular iteration, the data storage controller skips or repeats one or more steps in the sequence of operations for generating the composite data block based on a desired increase in bit space. To ensure that the decoder decodes the composite data block using the correct sequence of steps, the data storage controller encodes the sequence of steps in the composite data block for the decoder. For example, the data storage controller defines a sequence of bits for representing the operations "skip the index map before performing RLE", "iterate twice on the index map before performing RLE", etc., and appends this sequence of bits to the composite data block. In an embodiment, the data storage controller generates additional parity bits and/or error correction bits for the sequence of bits representing the sequence of operations, for protecting the sequence of bits and enabling decoding.

Figure 8:
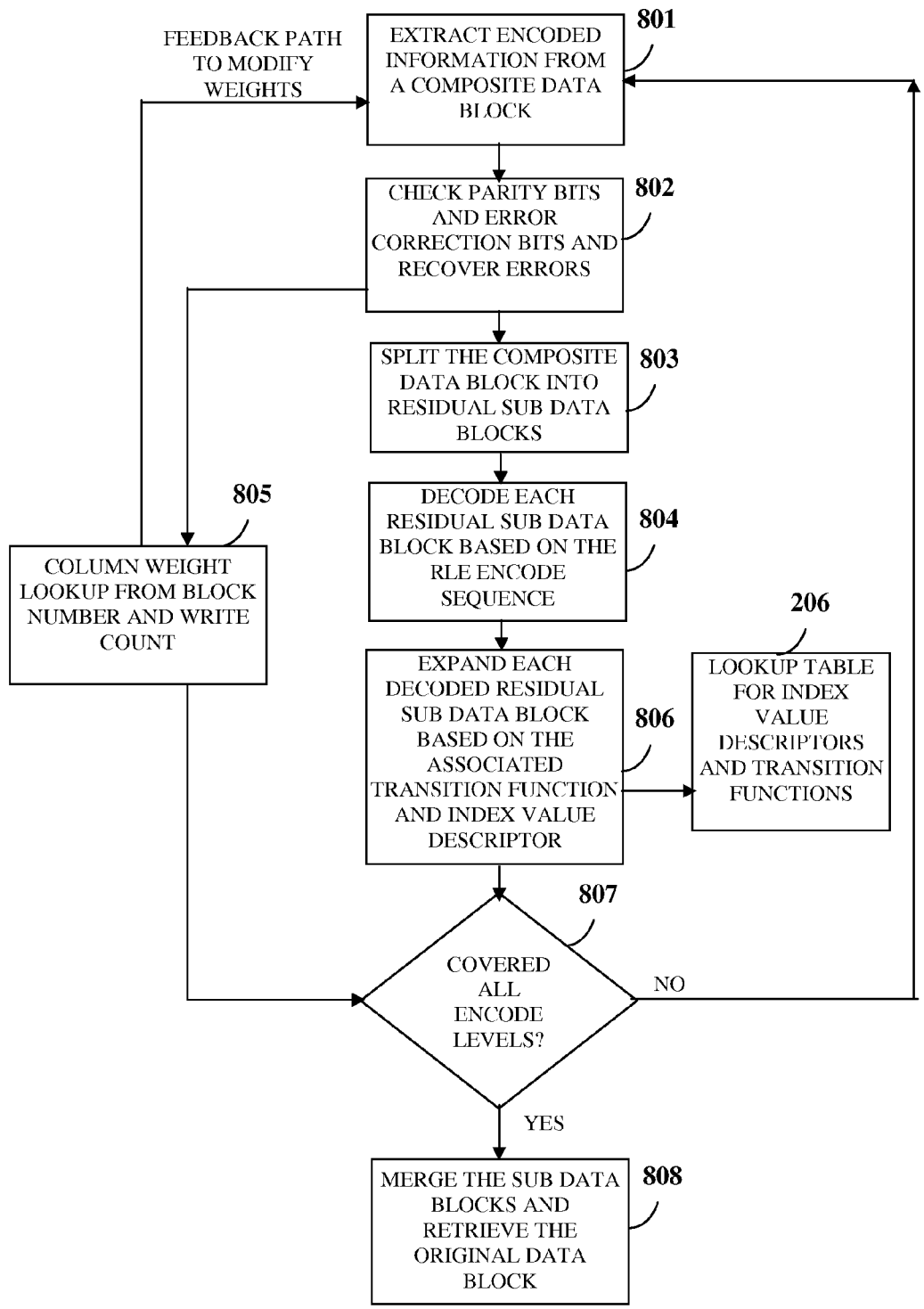
FIG. 8 exemplarily illustrates a flowchart comprising the steps for decoding a composite data block stored in the programmable data storage device to obtain the original data block using the data storage controller.

FIG. 8 exemplarily illustrates a flowchart comprising the steps for decoding a composite data block stored in the programmable data storage device to obtain the original data block using the data storage controller. The data storage controller extracts 801 the encoded information from the composite data block. The data storage controller uses the column weight lookup table 805 from the block number and the write count to retrieve the arrangement of bits in the composite data block prior to encoding based on the column weights. The data storage controller extracts the parity bits and the error correction bits, by locating the position of the parity bits and the error correction bits in association with the columns of the programmable data storage device, based on the column weights accessed from the column weight lookup table 805. The data storage controller checks 802 the parity bits and the error correction bits and recovers errors, for example, write errors in the composite data block. The data storage controller splits 803 the composite data block into residual sub data blocks. The data storage controller decodes 804 each residual sub data block based on a particular run length encoding (RLE) encode sequence used for encoding the selected transition vector associated with the residual sub data block. The data storage controller, for example, uses an RLE decoder to decompress the encoded data in the residual sub data block. The data storage controller expands 806 each decoded residual sub data block based on the information extracted from the lookup table 206 disclosed in the detailed description of FIG. 2, about the transition function selected during encoding, and the index value descriptors used during partitioning of the original data block to obtain each sub data block. The data storage controller checks 807 whether all the encode levels for a programmable cell are covered. That is, the data storage controller checks if all the encoding information associated with the iterations of partitioning, arranging, and encoding of the data block have been extracted for decoding. If all the encode levels are covered, then the data storage controller merges 808 the sub data blocks and retrieves the original data block. If all the encode levels are not covered, then the data storage controller continues to extract 801 the encoded information of the composite data block and repeats the steps 802, 803, 804, and 806 of decoding until all the encode levels are covered.

A few examples described below further illustrate the application of the method disclosed herein to a set of data blocks.

Consider an example where a 512-bit data block is encoded in a single iteration using the method disclosed herein. The data block considered is represented, for example, in a hexadecimal representation as follows:

421100A0E12100807DDFF77DDFF77DDFF7FD00502A-954AA552A9286400CCC300 C000A61300800080D7005-05555555555E56600101111111115100E0AA00200032

The data storage controller uses an index value descriptor that generates index maps for partitioning the data block into two 256-bit sub data blocks. The data storage controller checks if the number of ones is lesser than the required number of ones in a data block. The data storage controller determines that each of the 256-bit sub data blocks needs to be further partitioned into four 64-bit contiguous sub data blocks to achieve the desired number of ones in the data block. The data storage controller then applies a transition map comprising the transition functions, for example, ə, əə, əəə, əəəə, əəəəə, əəəəəə, əəəəəəə, and əəəəəəəə($ə^1 \ldots ə^8$), that are defined as disclosed in the detailed description of FIGS. 4-7, on each of the 64-bit sub data blocks to obtain the transition vectors. Furthermore, the data storage controller inserts a single invert bit along with each transition vector to determine whether the number of zeros is greater than the number of ones or the number of ones is greater than the number of zeros, for each transition vector. The data storage controller determines the largest ratio of ones to zeros for each of the 64-bit sub data blocks and accordingly, selects the corresponding transition vectors. The selected 64-bit transition vectors are collected together and appear as:
421100A0E121008082200882200882202809011080C060-3128169A1C04005100C000A 613008000808B01110000-000001B3060111000000015100E0AA00200032

In this example, only four of the eight sub data blocks are transformed. The changes in the sub data blocks subsequent to the transformation is represented, for example, by the code 01101100, where a 1 denotes that a corresponding sub data block of the eight sub data blocks has changed on applying a transition function to the sub data block. The data storage controller next determines the number of bits needed for encoding the index maps based on the index value descriptors. Considering 8 index maps, the total number of bits for storing information on the index maps is $\log_2$(Number of index maps=8)=3 bits, where $\log_2$ indicates logarithm to the base 2.

Considering the total number of bits required to encode the transition vectors, the data storage controller needs $\log_2$(number of toggle attempts=8)+number of invert bits (=1)=4 bits. The total number of 64-bit sub data blocks=8 (512/8). The number of sub data blocks with a change in bit count is 4. The number of bits for encoding the transition vector for each of the transformed sub data blocks is 4; this results in a total of 16 bits considering all the transition vectors. Therefore, the total number of bits for performing the encode operation is: (3)+(8)+(16)=27.

Furthermore, the total number of bits flipped is 89. That is, the difference between the total number of ones before the encoding and after the encoding is 89. In this example, 27 bits are used to reduce the number of ones in the original block by 89 bits.

The data storage controller next partitions the 512 bit data block into four 128-bit sub data blocks. The data storage controller applies index value descriptors to generate an index map set of length 16 comprising 16 index maps. Each index map splits the 128-bit data block into two 64-bit sub data blocks as indicated below:
B3060111000000015100E0AA00200032→3611000150-05080991A0201000028000 (16, 9) corresponds to an index map 7 in the index map set. The number of ones in the first 64-bit sub data block is 16 and the number of ones in the second 64-bit sub data block is 9.

C000A613008000808B01110000000001→C040000404-0000000B20603100091009 (5, 14) corresponds to an index map 8 in the index map set. The number of ones in the first 64-bit sub data block is 5, and the number of ones in the second 64-bit sub data block is 14.

28090110800060312816 9A1C04005100→40A1241041-29E9149A40020024801010 (19, 11) corresponds to an index map 2 in the index map set. The number of ones in the first 64-bit sub data block is 19, and the number of ones in the second 64-bit sub data block is 11.

421100A0E1210080822008822008 8220→100CC4089-42942948500910000000000 (18, 6) corresponds to index map 1 in the index map set. The number of ones in the first 64-bit sub data block is 18, and the number of ones in the second 64-bit sub data block is 6.

In this example, the data storage controller performs a partial run length encoding of the sub data blocks with the lowest number of ones. The data storage controller selects two sub data blocks with the lowest number of ones. The 64-bit sub data blocks with the lowest number of ones are, the sub data block with six ones, that is, 8500910000000000, and the sub data block with five ones, that is, C0400004040000000. The data storage controller performs base 6 run length encoding on these sub data blocks, needing 66 bits to encode the 128 bits in the two sub data blocks. The number of bits required for representing the RLE encoding comprises 4 bits to specify the selected sub data blocks on which the partial RLE encoding was performed, that is, an encoding string "0101" to represent the encoding status of the four 128 bit sub data blocks. The data storage controller uses 4 bits to represent the index map for each of the two sub data blocks. For example, since the individual index maps entries corresponding to the sub data blocks selected for RLE encoding are 8 and 1 respectively, the index map is encoded as "10000001". Furthermore, the data storage controller needs 3 bits to represent the RLE base of 16. This results in a total of 15 bits for representing RLE encoding.

Therefore, the data storage controller obtains a residual bit space generated from performing the encoding as: 128 (total number of bits from two 64-bit sub data blocks)—66 (number of bits obtained after compressing the two 64-bit sub data blocks using RLE encoding)—15 (representation of the RLE encode representation)—27 (number of bits for encoding the original index map and the transition vector) equal to 20 bits. The residual bit space is reduced by 2 bits to represent the algorithm flow, that is, the number of steps used to achieve the encoding. The data storage controller uses the additional 18 bits for inserting error correction code (ECC) bits and/or the parity bits, or for bypassing bad regions, for example, columns vulnerable to disturbance in the programmable data storage device using the column weights.

FIG. 9 exemplarily illustrates an input data block to be configured for storage in a programmable data storage device using the method disclosed herein. The following example describes the application of the method disclosed herein to a 4 kilobyte (32768 bits) data block collected from a portable document format (PDF) file. The data storage controller generates an index map set with 32 index maps using an index value descriptor. The data storage controller generates the 32 index maps by first traversing the 32768 bits of the data block. The data storage controller then uses the equations (1)-(3) disclosed in the detailed description of FIG. 1 to generate the index maps. For each of the index maps 0-31 corresponding to the 32 index maps in the index map set, the data storage controller retrieves the index map using prime numbers as disclosed in the detailed description of FIG. 1.

The data storage controller generates and stores the transition vectors of each transition set in a memory location of the data storage controller using one or more transition functions constituting a transition map. The data storage controller generates 8 transition sets using the transition functions $\partial_0\partial_1\partial_2\partial_3\partial_4\partial_5\partial_6\partial_7$. The data storage controller further expands each transition set by generating 15 consecutive transition vectors using the transition functions denoted by $\partial^1$ through $\partial^{15}$ as disclosed in the detailed description of FIGS. 4-7, for each of the transition sets. The data storage controller selects one of the transition vectors in each of the transition sets based on the selection criteria as disclosed in the detailed description of FIG. 1. The data storage controller encodes information on each of the selected transition vectors using the group number to represent the transition set and the index of the transition vector in the memory location using the notation: <3 bit group number>, <4 bit consecutive transition vector>→7 bits.

The data storage controller further partitions each of the 16384-bit sub data blocks generated by the preliminary index map into 64-bit sub data blocks. The data storage controller applies the transition function to each of the 64-bit sub data blocks to generate transition vectors that constitute a transition set for each of the 64-bit sub data blocks. The data storage controller then applies selection criteria to select a transition vector from a corresponding transition set for each of the 64-bit sub data blocks. In this example, the selection criterion is the lowest number of ones or zeros. Therefore, in each step, the data storage controller counts the number of ones and zeros and selects the transition vector with the lowest number of ones or zeros.

Consider a 16384-bit sub data block transformed into a set of transition vectors, for each of the 32 index maps. The data storage controller selects a transition vector with the lowest number of ones as exemplarily illustrated by the 32 element index map set below:

[4466, 5361], [5021, 4816], [4832, 5086], [4682, 4835],
[4909, 5082], [5040, 5075], [4976, 5152], [5026, 5057],
[5096, 5255], [5113, 5233], [5105, 5072], [5168, 4979],
[5176, 5204], [5131, 5158], [5148, 5039], [5178, 5195],
[5203, 5239], [5210, 5234], [5242, 5237], [5242, 5234],
[5218, 5215], [5223, 5127], [5196, 5223], [5264, 5133],
[5236, 5085], [5286, 5177], [5268, 5230], [5292, 5189],
[5303, 5213], [5254, 5167], [5273, 4998], [5275, 4994]

For each element in the index map set, the first digit within the bracket denotes the number of ones in the first 16384-bit sub data block and the second digit within the bracket denotes the number of ones in the second 16384-bit sub data block. The data storage controller parses each of the 32 index maps and selects the index map 4, that is [4682, 4835], which has the least number of ones and zeros. The data storage controller determines that the number of ones prior to conversion of the first 16384-bit sub data block to a transition vector is 7517, and the number of ones subsequent to conversion of the first 16384-bit sub data block to a transition vector is 4682. The data storage controller determines that the number of ones prior to conversion of the second 16384-bit sub data block to a transition vector is 7641, and the number of ones subsequent to conversion of the second 16384-bit sub data block to a transition vector is 4835. The data storage controller performs run length encoding on the transition vector of the 16384-bit sub data block to obtain an encoded residual sub data block.

Figure 10:
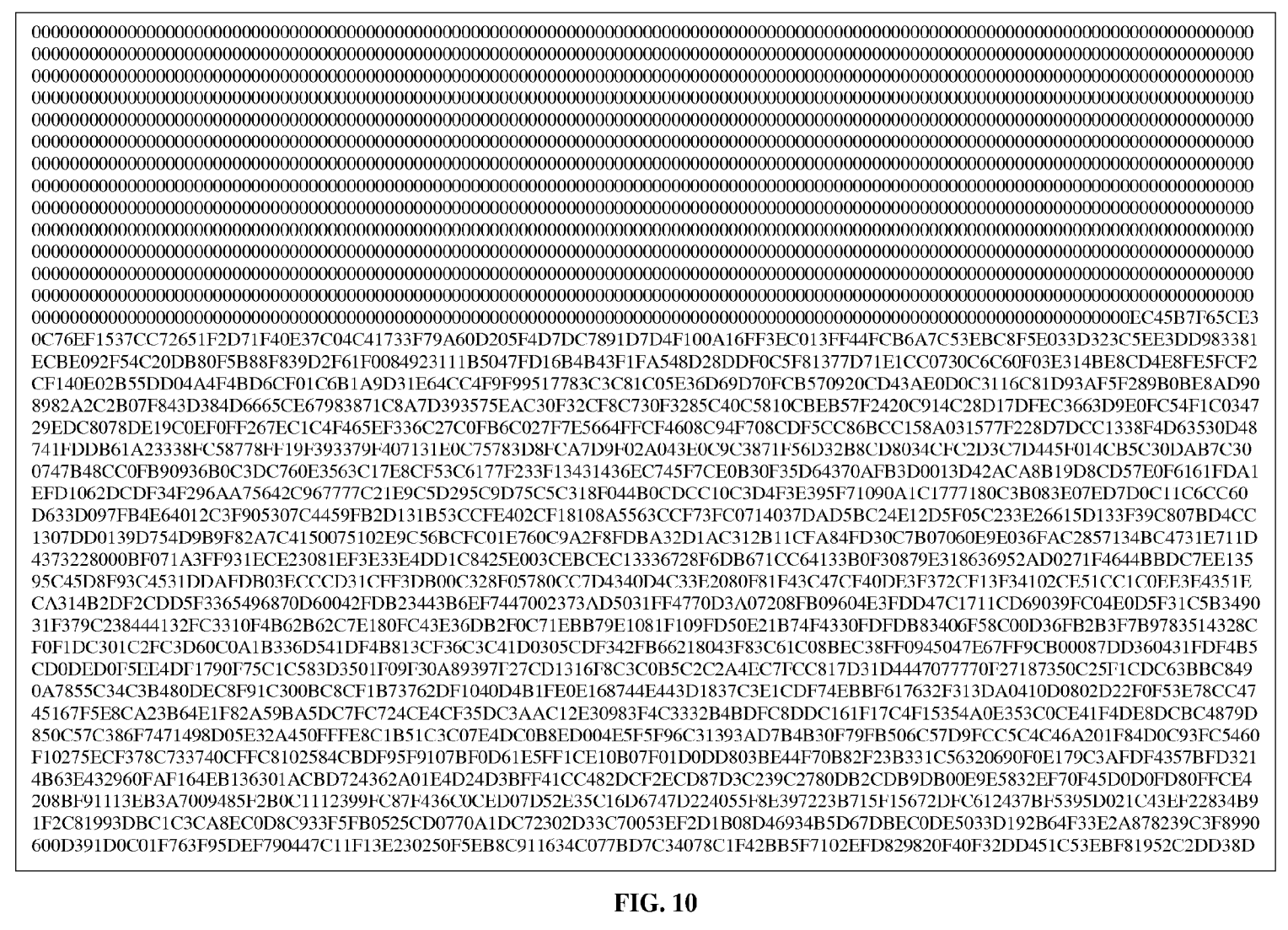

FIG. 10 exemplarily illustrates a data block obtained by merging residual sub data blocks obtained by performing run length encoding according to the method disclosed herein. This data block has a length of 25652 bits. In order to regenerate the original data block, the data storage controller stores all the parameters used to generate this block of data. The parameters stored by the data storage controller for generating this block of data and the total number of bits that the data storage controller stores to completely define each of the sub data blocks comprises, for example, an index number of the index map in the memory location comprising 5 bits to accommodate 32 index maps, a transition vector for each of the 64 bit blocks (512×7 bits), and a parameter specifying whether the specific 64 bit sub data block has more ones (1 bit×512). This results in an overhead of (5+512×7+1×512) equal to 4101 bits. Therefore, the increased bit space provided by the data storage controller is (32768−25652−4101) equal to 3015 bits that can be used to store the error correcting code (ECC) bits and the parity bits.

In another example, the data storage controller uses a different selection criterion. The data storage controller determines the number of 64-bit sub data blocks that have fewer than ⅓ of the total number of bits as ones, that is, lesser than 21 ones for 64 bits. A tally of the number of 64-bit sub data blocks with a number of ones less than 21, for the 32 index maps are:
[357/512, 339/512, 363/512, 348/512, 357/512, 337/512, 347/512, 347/512, 328/512, 337/512, 356/512, 337/512, 336/512, 358/512, 347/512, 344/512, 328/512, 336/512, 337/512, 350/512, 344/512, 345/512, 332/512, 330/512, 343/512, 340/512, 331/512, 336/512, 341/512, 350/512, 348/512, 348/512]

For this selection criterion, the third index map has the largest number of 64-bit sub data blocks with less than 21 ones. The data storage controller merges the two 16384-bit sub data blocks into one 32768-bit data block and partitions the 32768-bit data block into two sub data blocks. One sub data block comprises all the 363 64-bit sub data blocks that have less than 21 ones, and the other sub data block comprises the rest of the 149 64-bit sub data blocks.

The data storage controller performs run length encoding (RLE) on the 23232 bits (363 64-bit sub data blocks combined together) of the newly generated first sub data block to compress the total number of bits to 17938 bits. The data storage controller performs the steps of applying the transition function and RLE encoding on the second 9536-bit sub data block to save 2614 bits. The data storage controller uses an additional 512 bits to represent the masking bits for the 363 bits selected to generate the first sub data block. So the overall overhead for this scheme of partitioning the data block is 4101+512+5=4618 bits. This results in an increase in bit space equal to (((23232−17938)+(2614))−4618) equal to 3290 bits. The data storage controller can use the resulting increased bit space of 3290 bits for the ECC bits and/or the parity bits.

The example illustrated above depicts a single iteration of the steps performed to encode a data block. However, the bits that store information on the encoding along with the associated ECC and/or parity bits for the encoding operation are appended to the block of data resulting from performance of run length encoding (RLE) and the iteration is repeated to create larger bit lengths for alignment or error correction.

Consider another example where the data storage controller applies the method disclosed herein to data blocks of size 256 bits. The data storage controller uses a prime number based index value descriptor as disclosed in the detailed description of FIG. 1. The transition set comprises 16 consecutive transition vectors ($\partial^0 \ldots \partial^{15}$). The data storage controller partitions the 256-bit data block into two 128-bit sub data blocks based on a set of index value descriptors. The data storage controller further partitions each 128-bit sub data block into two 64-bit sub data blocks before applying the transition functions to generate the transition vectors. The input data block represented, for example, in a hexadecimal notation is:
7FF500C0E7F3F97C3E9F00B0000028954AA552A9542-A9500C045EC004041ED00

On applying an index map set of length 32, and a set of transition functions defined by the equations (4)-(6) disclosed in the detailed description of FIG. 1, the data storage controller obtains the following block of data:
8480C01400350022180000017CA401C8003192133C589-3C42000070101096850

The number of ones in the first 128-bit sub data block for the eighth index map before applying the transition function is 39. The number of ones in the corresponding 128-bit transition vector after applying the transition function on the first 128-bit sub data block is 36. The number of ones in the second 128-bit sub data block for the eighth index map before applying the transition function is 62. The number of ones in the corresponding 128-bit transition vector after applying the transition function on the second 128-bit sub data block is 28.

The data storage controller then performs base 2 RLE encoding on the 128-bit transition vectors to obtain residual sub data blocks represented together as:
00000000000000003BC7D3F16FCCBFFD0099F09FCCA-3880D3A033BFC3FCE44D3 Considering the two 128-bit residual sub data blocks together, after performing RLE, the data storage controller compresses the block of data to 192 bits, thereby releasing a bit space of (256-192) equal to 64 bits.

The "encode cost", that is, the total number of bits for encoding the data block is:
5 bits (32 index maps)+4(number of sub data blocks)*4(number of transition vectors per sub data block) bits=21 bits. The total number of bits saved is (64−21)=43 bits. Considering a number of bits designated by the data storage controller for representing the sequence of operations for generating the composite data block as disclosed in the detailed description of FIG. 7, the number of bits saved is about 30 bits.

The data storage controller uses another index map on the resulting block of data before performing RLE. The data storage controller uses a pseudorandom binary sequence (PRBS) generator, with a PRBS tap of "0b11100001" to generate the index map. The data storage controller outputs a single block of data after the mapping, by using a one-to-one mapping of index maps to the sub data blocks.

The resulting block of data is:
2C0101204A80C082FA278A8E0043484018020292A502-11404480080244144060. Furthermore, the application of base 2 RLE encoding to this block of data results in compressing the total number of bits of the block of data to 182 bits. This results in saving a number of bits equal to (256−21−182) equal to 53 bits.

Considering another 256-bit data block:
B64700C8B900D8B66DDBB6ED00C0CBBCCCCBBCC-CCB3C9B00F4577FF5577FF 557. The data storage controller uses a length 32 index map set to generate sub data blocks. The data storage controller selects the third index map in the index map set, and a set of transition functions defined by the equations (4)-(6) disclosed in the detailed description of FIG. 1, to generate:
13C23B023883102155C498042D20010D006E5900205E1-330627600069F400010

The number of ones in the first 128-bit sub data block before applying the transition function is 65. The number of ones in the corresponding 128-bit transition vector after applying the transition function to the first 128-bit sub data block is 38. The number of ones in the second 128-bit sub data block before applying the transition function to the second 128-bit sub data block is 65. The number of ones in the corresponding 128-bit transition vector after applying the transition function to the second 128-bit sub data block is 38.

The data storage controller performs RLE on each of the transition vectors resulting in the combined block of data represented by:
00000000003803C12F0DCECD543A0F3463F317C424A-FB4038873812FC6005FF3. This results in compression of the block of data to 214 bits.

The data storage controller performs a PRBS transformation to generate the index map set. The data storage controller partitions the data block using the index maps from the generated index map set, rearranges the bit sequence, and applies the transition functions defined by the equations (4)-(6) disclosed in the detailed description of FIG. 1 before performing RLE as:
2150D2F804C2408071E08E4020131DC0640C444091-CC0E481202FA00C2201A42

After performing RLE encoding on this block of data, the data storage controller generates the following block of data:
00000000000335319003E0EB3C301F08F3E3043CACFE-EC22C2AEF4017C3CF18D This results in a further compression of data to 210 bits. For optimal RLE encoding, the data storage controller further partitions each of the sub data blocks using distinct index value descriptors, in this example, generated by a PRBS generator.

Figure 11:
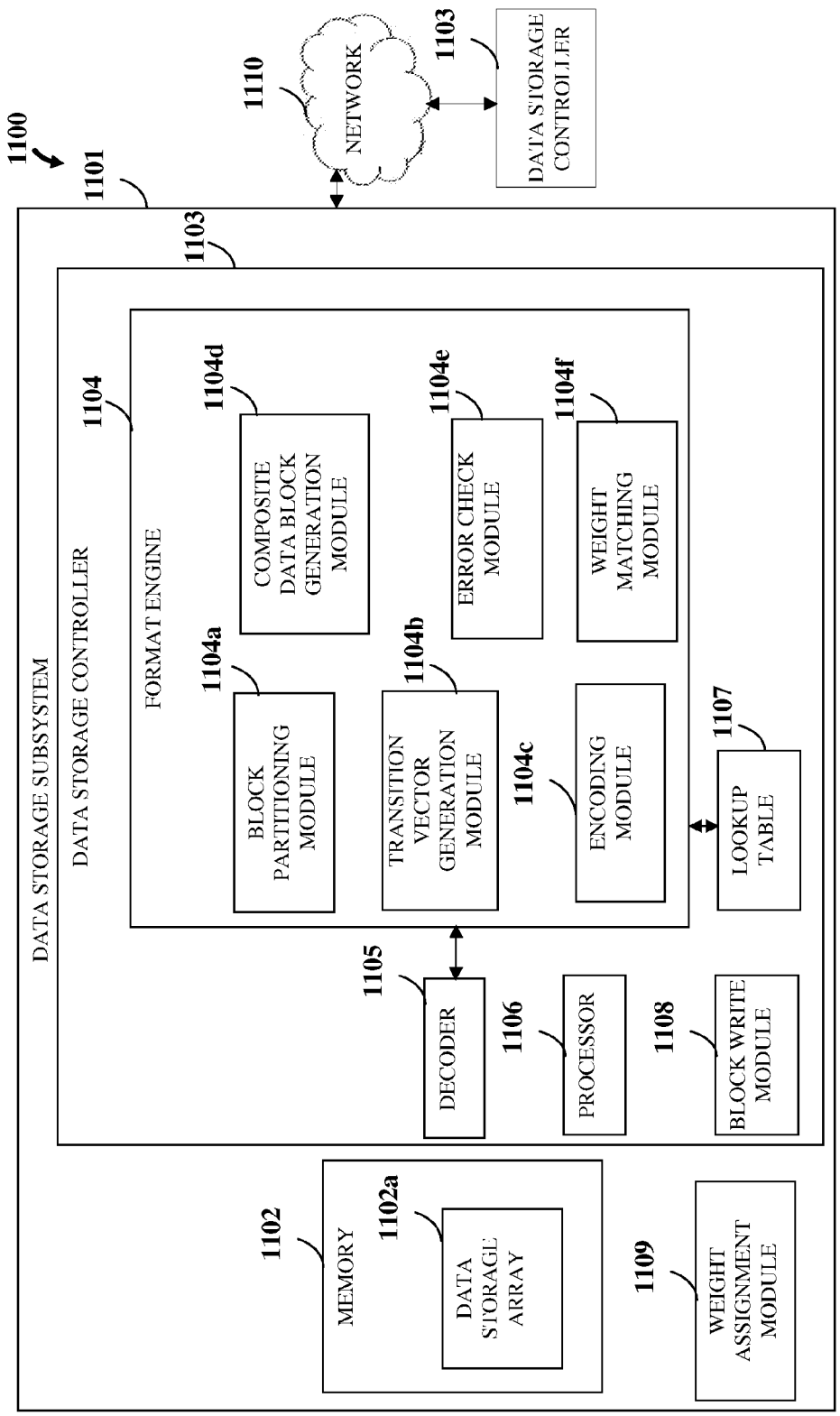
FIG. 11 exemplarily illustrates a system for managing storage of one or more data blocks in a programmable data storage device.

FIG. 11 exemplarily illustrates a system 1100 for managing storage of one or more data blocks in a programmable data storage device. The system 1100 disclosed herein comprises a data storage controller 1103 that interacts with a data storage array 1102a located in a memory 1102 of a programmable data storage device (not shown). In an embodiment, the data storage controller 1103 is disposed in a data storage sub system 1101 for managing storage and retrieval of the data blocks in the programmable data storage device. In an embodiment, the data storage controller 1103 communicates with other data storage controllers 1103 via a network 1110. The network 1110 is, for example, a local area network, a communication network implementing Wi-Fi® of the Wireless Ethernet Compatibility Alliance, Inc., a Bluetooth® communication network, a wireless universal serial bus (USB) communication network, etc. In an embodiment, the data storage array 1102a is embedded in the data storage controller 1103. The data storage array 1102a comprises pages having one or more rows and one or more columns. The data storage array 1102a stores one or more data blocks in the rows and the columns. Furthermore, the data storage array 1102a is programmed with a composite data block generated by the data storage controller 1103. The data storage sub system 1101 further comprises a weight assignment module 1109 for assigning weights to one or more columns of the data storage array 1102a.

The data storage controller 1103 controls the configuration of one or more data blocks for storage of the data blocks in the programmable data storage device. The data storage controller 1103 comprises a format engine 1104, a decoder 1105, a processor 1106, a block write module 1108, and a lookup table 1107. The format engine 1104 determines the format of the composite data block to be written to one or more regions, that is, columns in the programmable data storage device. The format engine 1104 comprises a block partitioning module 1104a, a transition vector generation module 1104b, an encoding module 1104c, a composite data block generation module 1104d, an error check module 1104e, and a weight matching module 1104f. The processor 1106 of the data storage controller 1103 is configured to execute modules 1104a, 1104b, 1104c, 1104d, 1104e, 1104f, 1105, 1108, etc., of the data storage controller 1103 as disclosed in the detailed description of FIG. 12. In an embodiment, the data storage controller 1103 comprises one or more processors 1106 for executing the modules 1104a, 1104b, 1104c, 1104d, 1104e, 1104f, 1105, 1108, etc.

The block partitioning module 1104a partitions each of the data blocks comprising multiple bits into multiple sub data blocks based on one or more index value descriptors stored in the lookup table 1107. Each of the sub data blocks comprises a distinct sequence of a number of bits. In an embodiment, the block partitioning module 1104a creates data redundancy by replicating the bits of one or more data blocks in one or more of the sub data blocks generated by partitioning the data blocks.

The transition vector generation module 1104b generates transition vectors from each of the sub data blocks by applying one or more transition functions on each of the sub data blocks. The transition functions are stored in the lookup table 1107. The transition vectors constitute a transition set for each of the sub data blocks. Each of the transition sets and the associated transition vectors are stored in a memory location in an input/output buffer 1201 of the data storage controller 1103 as exemplarily illustrated in FIG. 12. The transition vector generation module 1104b performs one or more reversible mathematical transformations on the distinct sequence of bits in each of the sub data blocks during generation of the transition vectors from each of the sub data blocks. In an embodiment, the transition vector generation module 1104b selects one of the transition vectors in the transition set based on selection criteria comprising, for example, a predetermined ratio of ones to zeros, a lowest number of ones or zeros, or a total number of ones lesser than a predetermined threshold, for encoding the selected transition vector. The transition vector generation module 1104b accesses each of the transition sets stored in the memory location of the input/output buffer 1201 exemplarily illustrated in FIG. 12 and compares each of the transition vectors within a transition set for the required selection criteria, for selecting a transition vector.

The encoding module 1104c encodes one of the transition vectors in the transition set, that is, the selected transition vector, for each of the sub data blocks for obtaining a residual sub data block comprising a reduced number of bits for each of the sub data blocks, resulting in increased bit space for accommodating parity bits and error correction bits. The encoding module 1104c performs, for example, run length encoding on the selected transition vector for each of the sub data blocks for obtaining the residual sub data block. The encoded transition vectors are stored in the input/output buffer 1201 exemplarily illustrated in FIG. 12. In an embodiment, the block partitioning module 1104a generates distinct index value descriptors for partitioning each of the sub data blocks for enabling an optimal performance of the encoding of the selected transition vector for each of the sub data blocks.

The composite data block generation module 1104d generates a composite data block by merging the residual sub data block of each of the sub data blocks and inserts information on the encoded index value descriptor used in partitioning the sub data blocks, the encoded transition vector, etc., into the composite data block. The generated composite data block comprises the increased bit space provided by each residual sub data block. The composite data block is configurable for writing the composite data block to one or more regions in the programmable data storage device free from a disturbance caused by a write operation to other regions in the programmable data storage device. In an embodiment, the composite data block generation module 1104d replicates one or more bits of the composite data block to one or more memory locations in the input/output buffer 1201 exemplarily illustrated in FIG. 12, of the data storage controller 1103 for creating data redundancy. The bits of the composite data block comprise one or more bits of the encoded transition vector in the composite data block. In an embodiment, the composite data block generation module 1104d in communication with the external weight assignment module 1109 arranges bits of the composite data block according to the weights assigned to the regions in the programmable data storage device, where the weights distinctly identify regions free from disturbance.

The error check module 1104e generates and adds one or more parity bits and error correction bits to the composite data block for enabling alignment and error correction of the composite data block stored in the programmable data storage device. In an embodiment, the error check module 1104e distributes the generated parity bits and error correction bits in the increased bit space of the composite data block over a length of the composite data block. In an embodiment, the error check module 1104e also generates distinct index value descriptors for distributing the generated error correction bits to one or more regions in the programmable data storage device for reducing burst errors. The error check module 1104e accesses the index value descriptors from the lookup table 1107. The error check module 1104e distributes the error correction bits to one or more columns in the programmable data storage device based on the weights assigned to the columns by the weight assignment module 1109.

The weight assignment module 1109 is disposed external to the data storage controller 1103. The weight assignment module 1109 electronically communicates with the data storage controller 1103. The weight assignment module 1109 assigns weights to one or more regions in the programmable data storage device for distinctly identifying the regions free from disturbance caused during a write operation of the composite data block to one or more regions in the programmable data storage device, by a write operation to other regions in the programmable data storage device. The weight matching module 1104f dynamically generates one or more distinct index value descriptors based on weights assigned to one or more regions in the programmable data storage device for collating bits of the composite data block, where the weights distinctly identify the regions free from disturbance.

The block write module 1108 writes the configured composite data block to one or more regions in the programmable data storage device free from a disturbance caused by a write operation to other regions in the programmable data storage device as disclosed in the detailed description of FIG. 1. The block write module 1108 skips or masks adjacent regions that are programmable on the programmable data storage device for writing the composite data block to one or more regions in the programmable data storage device free from the disturbance caused by a write operation to other regions in the programmable data storage device. In an embodiment, the block write module 1108 in communication with the decoder 1105 copies the composite data block written to one or more regions in the programmable data storage device to one or more other regions in the programmable data storage device. The decoder 1105 partially decodes the written composite data block based on one or more distinct index value descriptors dynamically generated based on weights assigned to the regions in the programmable data storage device. The block write module 1108 writes the partially decoded composite data block to the other regions in the programmable data storage device.

In an embodiment, the error check module 1104e performs error correction of the partially decoded composite data block using one or more of the error correction bits in the partially decoded composite data block and deletes the error correction bits of the partially decoded composite data block on completion of the error correction, prior to writing of the partially decoded composite data block by the block write module 1108 to other regions in the programmable data storage device. The error check module 1104e generates and adds one or more distinct error correction bits to the partially decoded composite data block. The block write module 1108 writes the partially decoded composite data block with the distinct error correction bits to other regions in the programmable data storage device based on weights assigned to the other regions in the programmable data storage device. In an embodiment, the block write module 1108 transmits the partially decoded composite data block to one or more other data storage controllers 1103 that are in communication with the data storage controller 1103 via the network 1110. Each of the other data storage controllers 1103 writes the transmitted partially decoded composite data block to one or more regions in their associated programmable data storage devices. The decoder 1105 performs the inverse of each of the steps of encoding, for example, performing RLE decoding to obtain residual sub data blocks, expanding each of the decoded sub data blocks based on index value descriptors, etc., as disclosed in the detailed description of FIG. 8.

Figure 12:
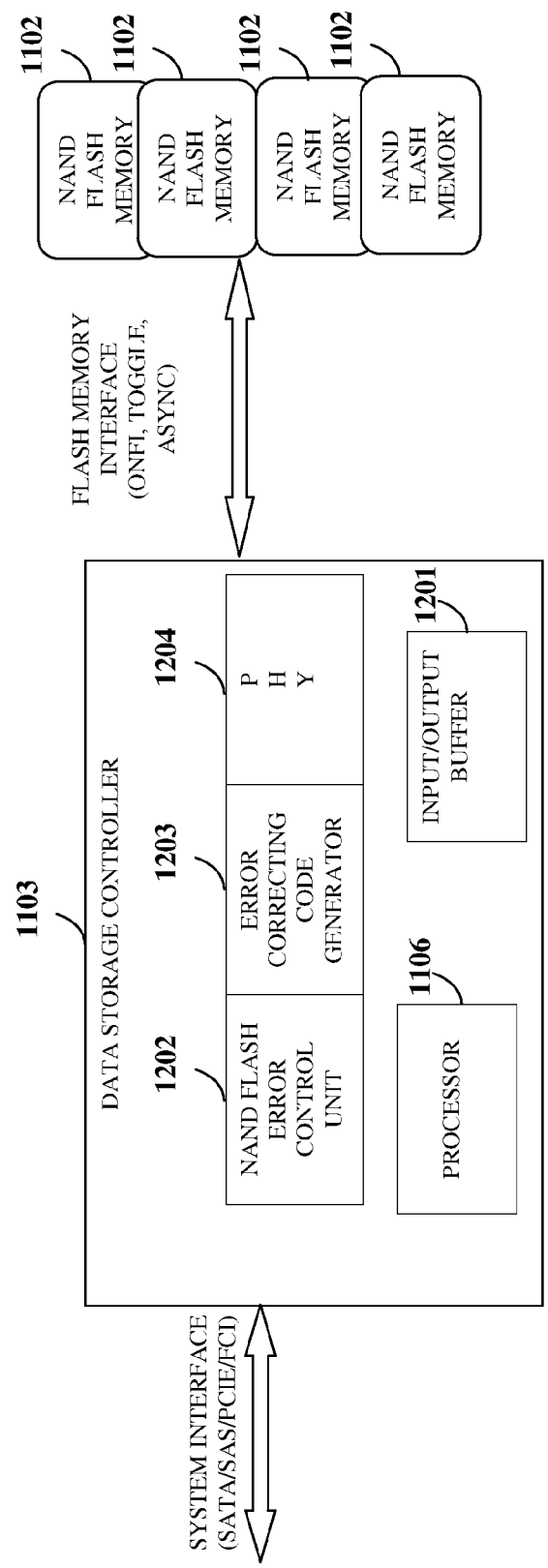
FIG. 12 exemplarily illustrates the architecture of the data storage controller that manages the storage of one or more data blocks in a programmable data storage device.

FIG. 12 exemplarily illustrates the architecture of the data storage controller 1103 that manages the storage of one or more data blocks in a programmable data storage device. The data storage controller 1103 is, for example, a microcontroller device such as a flash memory controller configured to program the programmable data storage device, for example, a flash memory device. The data storage controller 1103 comprises an input/output buffer 1201, a not AND (NAND) flash error control unit 1202, an error correcting code generator 1203, a physical layer 1204, and the processor 1106. The NAND flash error control unit 1202, in communication with the format engine 1104 exemplarily illustrated in FIG. 11, controls configuration of one or more data blocks for storage of the data blocks, for example, in a NAND flash memory 1102 of the programmable data storage device. The NAND flash error control unit 1202 is configured to perform error detection and correction along with error logging. The error correcting code generator 1203 in communication with the error check module 1104e adds error correcting code bits as part of the stored data to increase the number of bit errors that can be recovered. The physical layer 1204 provides timing for control pins to support synchronous interfaces and a bypass mode for standard asynchronous operation. The data storage controller 1103 supports a flash memory interface that provides an open NAND flash interface (ONFi), toggle mode support, and an asynchronous interface for enabling writing of a composite data block to one or more of multiple regions, for example, in the NAND flash memory 1102 of the programmable data storage device. The data storage controller 1103 further supports a system interface compliant with serial advanced technology attachment (SATA), serial attached small computer system interface (SAS), peripheral component interconnect express (PCIE), flat cable interface (FCI), etc. The processor 1106 identifies the device type, issues commands, executes program codes, stores the encode history, etc.

The data storage controller 1103 stores the index value descriptors, transition functions, cost functions, etc., in the lookup table 1107 exemplarily illustrated in FIG. 11. The data storage controller 1103 further stores the index maps, transition vectors, intermediate bit sequences, encoded bit sequences, etc., in memory locations in the input/output buffer 1201. Furthermore, the input/output buffer 1201 stores instructions adapted to be executed by the processor 1106, which causes the processor 1106 of the data storage controller 1103 to execute the modules 1104a, 1104b, 1104c, 1104d, 1104e, 1104f, 1105, 1108, etc., of the data storage controller 1103. For example, the block partitioning module 1104a, the transition vector generation module 1104b, the encoding module 1104c, the composite data block generation module 1104d, the error check module 1104e, the weight matching module 1104f, the block write module 1108, and the decoder 1105 of the data storage controller 1103 are stored in the input/output buffer 1201 of the data storage controller 1103. The input/output buffer 1201 of the data storage controller 1103 comprises volatile and/or non-volatile memory, for example, an embedded NAND flash memory, one or more read/write data buffers for storing the read data and write data, etc.

The processor 1106 retrieves the instructions for executing the modules, for example, 1104a, 1104b, 1104c, 1104d, 1104e, 1104f, 1105, 1108, etc., of the data storage controller 1103. The instructions fetched by the processor 1106 from the input/output buffer 1201 after being processed are decoded. The instructions are placed in an instruction register in the processor 1106. After processing and decoding, the processor 1106 executes the instructions. In an example, the block partitioning module 1104a defines instructions for partitioning each of the data blocks comprising multiple bits into multiple sub data blocks based on one or more index value descriptors. In an embodiment, the block partitioning module 1104a defines instructions for creating data redundancy by replicating the bits of each of the data blocks in one or more sub data blocks on partitioning each of the data blocks.

The transition vector generation module 1104b defines instructions for generating transition vectors from each of the sub data blocks by applying one or more transition functions on each of the sub data blocks. The transition vector generation module 1104b defines instructions for performing one or more reversible mathematical transformations on the distinct sequence of bits in each of the sub data blocks during generation of the transition vectors from each of the sub data blocks. In an embodiment, the transition vector generation module 1104b defines instructions for selecting one of the transition vectors in a transition set based on the selection criteria for encoding of the selected transition vector. The encoding module 1104c defines instructions for encoding one of the transition vectors in the transition set for each of the sub data blocks, for example, by performing run length encoding on the selected transition vector for each of the sub data blocks for obtaining a residual sub data block comprising a reduced number of bits for each of the sub data blocks, resulting in increased bit space for accommodating parity bits and error correction bits. Furthermore, in an embodiment, the block partitioning module 1104a defines instructions for generating distinct index value descriptors for partitioning each of the sub data blocks for enabling an optimal performance of encoding of the selected transition vector for each of the sub data blocks.

The composite data block generation module 1104d defines instructions for generating a composite data block by merging the residual sub data block of each of the sub data blocks. In an embodiment, the composite data block generation module 1104d defines instructions for configuring the composite data block for writing the composite data block to one or more regions in the programmable data storage device free from a disturbance caused by a write operation to other regions in the programmable data storage device. In an embodiment, the composite data block generation module 1104d defines instructions for replicating one or more bits, for example, one or more bits of the encoded transition vector, of the composite data block to one or more memory locations in the data storage controller 1103 for creating data redundancy.

The error check module 1104e defines instructions for generating and adding parity bits and error correction bits to the composite data block for enabling alignment and error correction of the composite data block. Furthermore, the error check module 1104e defines instructions for distributing the generated parity bits and/or the error correction bits in the increased bit space of the composite data block over a length of the composite data block. In an embodiment, the error check module 1104e defines instructions for generating distinct index value descriptors for distributing the generated error correction bits to one or more regions in the programmable data storage device for reducing burst errors.

Furthermore, the weight matching module 1104f defines instructions for dynamically generating one or more distinct index value descriptors based on weights assigned to one or more regions in the programmable data storage device by the external weight assignment module 1109 for collating bits of the composite data block.

The block write module 1108 defines instructions for writing the configured composite data block to one or more regions in the programmable data storage device free from a disturbance caused by a write operation to other regions in the programmable data storage device. The block write module 1108 defines instructions for skipping or masking adjacent regions that are programmable on the programmable data storage device for writing the composite data block to one or more regions in the programmable data storage device free from disturbance caused by the write operation to other regions in the programmable data storage device.

In an embodiment, the block write module 1108 defines instructions for copying the composite data block written to the regions in the programmable data storage device to one or more other regions in the programmable data storage device. The decoder 1105 defines instructions for partially decoding the written composite data block based on one or more distinct index value descriptors dynamically generated based on the weights assigned to the regions in the programmable data storage device. The block write module 1108 defines instructions for writing the partially decoded composite data block to other regions in the programmable data storage device based on weights assigned to the other regions in the programmable data storage device.

In an embodiment, the error check module 1104e defines instructions for performing error correction of the partially decoded composite data block using one or more of the error correction bits in the partially decoded composite data block and deletes the error correction bits of the partially decoded composite data block on completion of the error correction, prior to writing of the partially decoded composite data block by the block write module 1108 to the other regions in the programmable data storage device. The error check module 1104e defines instructions for generating and adding one or more distinct error correction bits to the partially decoded composite data block. The block write module 1108 defines instructions for writing the partially decoded composite data block with the distinct error correction bits to other regions in the programmable data storage device based on weights assigned to the other regions in the programmable data storage device. In an embodiment, the block write module 1108 defines instructions for transmitting the partially decoded composite data block to one or more other data storage controllers 1103 that are in communication with the data storage controller 1103 via the network 1110.

The processor 1106 of the data storage controller 1103 retrieves the instructions defined by the block partitioning module 1104a, the transition vector generation module 1104b, the encoding module 1104c, the composite data block generation module 1104d, the error check module 1104e, the weight matching module 1104f, the block write module 1108, the decoder 1105, etc., and executes the instructions. At the time of execution, the instructions stored in the input/output buffer 1201 are analyzed by the processor 1106 to determine the operations to be performed. The processor 1106 then performs the specified operations. The operations comprise arithmetic operations and logic operations.

Disclosed herein is also a computer program product comprising a non-transitory computer readable storage medium which stores computer program codes comprising instructions executable by at least one processor 1106. As used herein, the term "non-transitory computer readable storage medium" refers to all computer readable media, for example, non-volatile media such as optical disks or magnetic disks, volatile media such as a register memory, a processor cache, etc., and transmission media such as wires that constitute a system bus coupled to the processor 1106, except for a transitory, propagating signal. The computer program product disclosed herein comprises multiple computer program codes for managing the storage of one or more data blocks in a programmable data storage device. For example, the computer program product disclosed herein comprises a first computer program code for partitioning each of one or more data blocks comprising multiple bits into multiple sub data blocks based on one or more index value descriptors, where each of the sub data blocks comprise a distinct sequence of a number of bits; a second computer program code for generating transition vectors from each of the sub data blocks by applying one or more transition functions on each of the sub data blocks; a third computer program code for encoding one of the transition vectors in the transition set for each of the sub data blocks for obtaining a residual sub data block comprising a reduced number of bits for each of the sub data blocks, resulting in increased bit space for accommodating parity bits and error correction bits; and a fourth computer program code for generating a composite data block by merging the residual sub data block of each of the sub data blocks, where the composite data block comprises increased bit space provided by each residual sub data block, and wherein the composite data block is configurable for writing the composite data block to one or more regions in the programmable data storage device free from a disturbance caused by a write operation to other regions in the programmable data storage device. The computer program product disclosed herein further comprises additional computer program codes for performing additional steps that may be required and contemplated for managing the storage of the data blocks in the programmable data storage device.

The computer program codes comprising the computer executable instructions are embodied on the non-transitory computer readable storage medium. The processor 1106 retrieves these computer executable instructions and executes them. When the computer executable instructions are executed by the processor 1106, the computer executable instructions cause the processor 1106 to perform the method steps for managing the storage of the data blocks in the programmable data storage device. In an embodiment, a single piece of computer program code comprising computer executable instructions performs one or more steps of the method disclosed herein for managing the storage of one or more data blocks in a programmable data storage device.

The data storage controller 1103 can be programmed using a number of modes of programming. The data storage controller 1103 is, for example, a standalone device programmed using standard computer interfaces such as recommended standard-232 (RS 232), universal serial bus USB2, USB3 interfaces, peripheral component interconnect (PCI) express interface, etc. In another example, the data storage controller 1103 resides inside a solid state drive (SSD) controller where the programming is accomplished through standard on-chip interconnects, for example, an advanced microcontroller bus architecture (AMBA) bus, an advanced extensible interface (AXI) bus, etc.

The data storage controller 1103 reduces the number of cells required to be programmed for storing a data block. The data storage controller 1103 skews the programmed cells into rows based on a page and column number to minimize the effect of disturbance caused during a write operation to the regions in the programmable data storage device by a write operation to the neighboring regions in the programmable data storage device, referred to herein as "program disturb". The data storage controller 1103 adds additional parity bits to protect the bits representing the sequence of operations that define the data transformation and to recover bit errors that cannot be detected by the existing error correcting code (ECC). The data storage controller 1103 encodes a data block without increasing the block size in the programmable data storage device. In an embodiment, the data storage controller 1103 supports all programmable data storage devices, for example, NAND flash memory devices. The method and system 1100 disclosed herein improves block format based on encode history and protects the formatted block with parity. The method and system 1100 disclosed herein improves retention as part of a block rewrite, that is, every time the encoded data passes through.

It will be readily apparent that the various methods and algorithms disclosed herein may be implemented on computer readable media appropriately programmed for general purpose computers and computing devices. As used herein, the term "computer readable media" refers to non-transitory computer readable media that participate in providing data, for example, instructions that may be read by a computer, a processor or a like device. Non-transitory computer readable media comprise all computer readable media, for example, non-volatile media, volatile media, and transmission media, except for a transitory, propagating signal. Non-volatile media comprise, for example, optical disks or magnetic disks and other persistent memory volatile media including a dynamic random access memory (DRAM), which typically constitutes a main memory. Volatile media comprise, for example, a register memory, a processor cache, a random access memory (RAM), etc. Transmission media comprise, for example, coaxial cables, copper wire and fiber optics, including wires that constitute a system bus coupled to a processor. Common forms of computer readable media comprise, for example, a floppy disk, a flexible disk, a hard disk, magnetic tape, any other magnetic medium, a compact disc-read only memory (CD-ROM), a digital versatile disc (DVD), any other optical medium, punch cards, paper tape, any other physical medium with patterns of holes, a random access memory (RAM), a programmable read only memory (PROM), an erasable programmable read only memory (EPROM), an electrically erasable programmable read only memory (EEPROM), a flash memory, any other memory chip or cartridge, or any other medium from which a computer can read. A "processor" refers to any one or more microprocessors, central processing unit (CPU) devices, computing devices, microcontrollers, digital signal processors or like devices. Typically, a processor receives instructions from a memory or like device and executes those instructions, thereby performing one or more processes defined by those instructions. Further, programs that implement such methods and algorithms may be stored and transmitted using a variety of media, for example, the computer readable media in a number of manners. In an embodiment, hard-wired circuitry or custom hardware may be used in place of, or in combination with, software instructions for implementation of the processes of various embodiments. Therefore, the embodiments are not limited to any specific combination of hardware and software. In general, the computer program codes comprising computer executable instructions may be implemented in any programming language. Some examples of languages that can be used comprise C, C++, C#, Perl, Python, or JAVA. The computer program codes or software programs may be stored on or in one or more mediums as object code. The computer program product disclosed herein comprises computer executable instructions embodied in a non-transitory computer readable storage medium, wherein the computer program product comprises computer program codes for implementing the processes of various embodiments.

The present invention can be configured to work in a network environment including a computer that is in communication with one or more devices via a communication network. The computer may communicate with the devices directly or indirectly, via a wired medium or a wireless medium such as the Internet, a local area network (LAN), a wide area network (WAN) or the Ethernet, token ring, or via any appropriate communications means or combination of communications means. Each of the devices may comprise computers such as those based on the Intel® processors, AMD® processors, UltraSPARC® processors, IBM® processors, etc., that are adapted to communicate with the computer. Any number and type of machines may be in communication with the computer.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials, and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

I claim:

1. A method for managing storage of one or more data blocks in a programmable data storage device, comprising:

providing a data storage controller comprising at least one processor configured to control configuration of said one or more data blocks for said storage of said one or more data blocks in said programmable data storage device;

partitioning each of said one or more data blocks comprising a plurality of bits into a plurality of sub data blocks by said data storage controller based on one or more index value descriptors, wherein each of said sub data blocks comprises a distinct sequence of a number of said bits;

generating transition vectors from each of said sub data blocks by applying one or more transition functions on said each of said sub data blocks by said data storage controller, wherein said transition vectors constitute a transition set for said each of said sub data blocks;

encoding one of said transition vectors in said transition set for said each of said sub data blocks by said data storage controller for obtaining a residual sub data block comprising a reduced number of said number of said bits for said each of said sub data blocks, resulting in increased bit space for accommodating parity bits and error correction bits; and generating a composite data block by merging said residual sub data block of said each of said sub data blocks by said data storage controller, wherein said composite data block comprises said increased bit space provided by each said residual sub data block, and wherein said composite data block is configurable for writing said composite data block to one or more of a plurality of regions in said programmable data storage device free from a disturbance caused by a write operation to each of another one or more of said regions in said programmable data storage device.

2. The method of claim 1, wherein said encoding of said one of said transition vectors in said transition set for said each of said sub data blocks comprises performing run length encoding on said one of said transition vectors for said each of said sub data blocks by said data storage controller for obtaining said residual sub data block comprising said reduced number of said number of said bits for said each of said sub data blocks.

3. The method of claim 1, further comprising generating and adding one or more of said parity bits and said error correction bits to said composite data block by said data storage controller for enabling alignment and error correction of said composite data block.

4. The method of claim 3, wherein said addition of said one or more of said parity bits and said error correction bits comprises distributing said generated one or more of said parity bits and said error correction bits in said increased bit space of said composite data block over a length of said composite data block by said data storage controller.

5. The method of claim 1, further comprising generating distinct index value descriptors for distributing said error correction bits to said one or more of said regions in said programmable data storage device by said data storage controller for reducing burst errors.

6. The method of claim 1, further comprising replicating one or more bits of said composite data block to one or more memory locations in said data storage controller for creating data redundancy, wherein said one or more bits of said composite data block comprise one or more bits of said encoded one of said transition vectors in said composite data block.

7. The method of claim 1, further comprising generating distinct index value descriptors for partitioning each of said sub data blocks by said data storage controller for enabling an optimal performance of said encoding of said one of said transition vectors for said each of said sub data blocks.

8. The method of claim 1, wherein said generation of said transition vectors from said each of said sub data blocks comprises performing one or more reversible mathematical transformations on said distinct sequence of said number of said bits in said each of said sub data blocks by said data storage controller.

9. The method of claim 1, further comprising selecting said one of said transition vectors in said transition set based on selection criteria by said data storage controller for said encoding of said selected one of said transition vectors.

10. The method of claim 9, wherein said selection criteria comprise one of a predetermined ratio of one bits to zero bits, a lowest number of one of one bits and zero bits, and a total number of one bits lesser than a predetermined threshold.

11. The method of claim 1, further comprising assigning weights to said one or more of said regions in said programmable data storage device for distinctly identifying said one or more of said regions free from said disturbance.

12. The method of claim 11, wherein said assignment of said weights to said one or more of said regions in said programmable data storage device is based on one or more of a location of said one or more of said regions in said programmable data storage device, an organization of programmable cells in said one or more of said regions, a number of prior write operations performed on said one or more of said regions, and a number of times of movement of bits associated with said one or more of said regions in said programmable data storage device.

13. The method of claim 1, wherein said configuration of said composite data block for said writing of said composite data block to said one or more of said regions in said programmable data storage device comprises dynamically generating one or more distinct index value descriptors based on weights assigned to said one or more of said regions in said programmable data storage device by said data storage controller for collating bits of said composite data block.

14. The method of claim 13, further comprising copying said composite data block written to said one or more of said regions in said programmable data storage device to another one or more of said regions in said programmable data storage device by said data storage controller, wherein said copying of said composite data block comprises:
    partially decoding said written composite data block based on said dynamically generated one or more distinct index value descriptors; and
    writing said partially decoded composite data block to said another one or more of said regions in said programmable data storage device.

15. The method of claim 14, further comprising performing error correction of said partially decoded composite data block by said data storage controller using one or more of said error correction bits in said partially decoded composite data block and deleting said one or more of said error correction bits of said partially decoded composite data block on completion of said error correction by said data storage controller, prior to said writing of said partially decoded composite data block to said another one or more of said regions in said programmable data storage device.

16. The method of claim 15, further comprising generating and adding one or more distinct error correction bits to said partially decoded composite data block by said data storage controller and performing said writing of said partially decoded composite data block with said one or more distinct error correction bits to said another one or more of said regions in said programmable data storage device by said data storage controller based on weights assigned to said another one or more of said regions in said programmable data storage device.

17. The method of claim 14, further comprising transmitting said partially decoded composite data block to one or more other data storage controllers in communication with said data storage controller via a network for writing said transmitted partially decoded composite data block to one or more of a plurality of regions in another said programmable data storage device associated with said each of said one or more other data storage controllers.

18. The method of claim 1, further comprising one or more of skipping and masking adjacent said regions that are programmable on said programmable data storage device by said data storage controller for performing said writing of said composite data block to said one or more of said regions in said programmable data storage device free from said disturbance caused by said write operation to said each of said another one or more of said regions in said programmable data storage device.

19. The method of claim 1, further comprising creating data redundancy by replicating said bits of said each of said one or more data blocks in one or more of said sub data blocks by said data storage controller on said partitioning of said each of said one or more data blocks.

20. A system for managing storage of one or more data blocks in a programmable data storage device, comprising:
    a data storage controller that controls configuration of said one or more data blocks for said storage of said one or more data blocks in said programmable data storage device, said data storage controller comprising at least one processor configured to execute modules of said data storage controller, said modules of said data storage controller comprising:
        a block partitioning module that partitions each of said one or more data blocks comprising a plurality of bits into a plurality of sub data blocks based on one or more index value descriptors, wherein each of said sub data blocks comprises a distinct sequence of a number of said bits;
        a transition vector generation module that generates transition vectors from each of said sub data blocks by applying one or more transition functions on said each of said sub data blocks, wherein said transition vectors constitute a transition set for said each of said sub data blocks;
        an encoding module that encodes one of said transition vectors in said transition set for said each of said sub data blocks for obtaining a residual sub data block comprising a reduced number of said number of said bits for said each of said sub data blocks, resulting in increased bit space for accommodating parity bits and error correction bits; and
        a composite data block generation module that generates a composite data block by merging said residual sub data block of said each of said sub data blocks, wherein said composite data block comprises said increased bit space provided by each said residual sub data block, and wherein said composite data block is configurable for writing said composite data block to one or more of a plurality of regions in said programmable data storage device free from a disturbance caused by a write operation to each of another one or more of said regions in said programmable data storage device.

21. The system of claim 20, wherein said block partitioning module generates distinct index value descriptors for partitioning each of said sub data blocks for enabling an optimal performance of said encoding of said one of said transition vectors for said each of said sub data blocks.

22. The system of claim 20, wherein said block partitioning module creates data redundancy by replicating said bits of said each of said one or more data blocks in one or more of said sub data blocks on said partitioning of said each of said one or more data blocks.

23. The system of claim 20, wherein said encoding module encodes said one of said transition vectors in said transition set for said each of said sub data blocks by performing run length encoding on said one of said transition vectors for said each of said sub data blocks for obtaining said residual sub data block comprising said reduced number of said number of said bits for said each of said sub data blocks.

24. The system of claim 20, wherein said modules of said data storage controller further comprise an error check module that generates and adds one or more of said parity bits and said error correction bits to said composite data block for enabling alignment and error correction of said composite data block.

25. The system of claim 24, wherein said error check module performs one or more of:
 distributing said generated one or more of said parity bits and said error correction bits in said increased bit space of said composite data block over a length of said composite data block; and
 generating distinct index value descriptors for distributing said generated one or more of said error correction bits to said one or more of said regions in said programmable data storage device for reducing burst errors.

26. The system of claim 20, wherein said composite data block generation module replicates one or more bits of said composite data block to one or more memory locations in said data storage controller for creating data redundancy, wherein said one or more bits of said composite data block comprise one or more bits of said encoded one of said transition vectors in said composite data block.

27. The system of claim 20, wherein said transition vector generation module performs one or more reversible mathematical transformations on said distinct sequence of said number of said bits in said each of said sub data blocks during said generation of said transition vectors from said each of said sub data blocks.

28. The system of claim 20, wherein said transition vector generation module selects said one of said transition vectors in said transition set based on selection criteria for said encoding of said selected one of said transition vectors, wherein said selection criteria comprise one of a predetermined ratio of one bits to zero bits, a lowest number of one of one bits and zero bits, and a total number of one bits lesser than a predetermined threshold.

29. The system of claim 20, further comprising a weight assignment module external to said data storage controller, wherein said weight assignment module assigns weights to said one or more of said regions in said programmable data storage device for distinctly identifying said one or more of said regions free from said disturbance.

30. The system of claim 20, wherein said modules of said data storage controller further comprise a weight matching module that dynamically generates one or more distinct index value descriptors based on weights assigned to said one or more of said regions in said programmable data storage device for collating bits of said composite data block.

31. The system of claim 20, wherein said modules of said data storage controller further comprise a block write module that performs one or more of skipping and masking adjacent said regions that are programmable on said programmable data storage device for performing said writing of said composite data block to said one or more of said regions in said programmable data storage device free from said disturbance caused by said write operation to said each of said another one or more of said regions in said programmable data storage device.

32. The system of claim 31, wherein said block write module in communication with a decoder copies said composite data block written to said one or more of said regions in said programmable data storage device to another one or more of said regions in said programmable data storage device, wherein said decoder partially decodes said written composite data block based on one or more distinct index value descriptors dynamically generated based on weights assigned to said one or more of said regions in said programmable data storage device, and wherein said block write module writes said partially decoded composite data block to said another one or more of said regions in said programmable data storage device.

33. The system of claim 32, wherein said modules of said data storage controller further comprise an error check module that performs error correction of said partially decoded composite data block using one or more of said error correction bits in said partially decoded composite data block and deletes said one or more of said error correction bits of said partially decoded composite data block on completion of said error correction, prior to said writing of said partially decoded composite data block by said block write module to said another one or more of said regions in said programmable data storage device.

34. The system of claim 33, wherein said error check module generates and adds one or more distinct error correction bits to said partially decoded composite data block, and wherein said block write module performs said writing of said partially decoded composite data block with said one or more distinct error correction bits to said another one or more of said regions in said programmable data storage device based on weights assigned to said another one or more of said regions in said programmable data storage device.

35. The system of claim 32, wherein said block write module transmits said partially decoded composite data block to one or more other data storage controllers in communication with said data storage controller via a network, wherein each of said one or more other data storage controllers writes said transmitted partially decoded composite data block to one or more of a plurality of regions in another said programmable data storage device associated with said each of said one or more other data storage controllers.

36. A computer program product comprising a non-transitory computer readable storage medium, said non-transitory computer readable storage medium storing computer program codes comprising instructions executable by at least one processor, said computer program codes comprising:
 a first computer program code for partitioning each of one or more data blocks comprising a plurality of bits into a plurality of sub data blocks based on one or more index value descriptors, wherein each of said sub data blocks comprises a distinct sequence of a number of said bits;
 a second computer program code for generating transition vectors from each of said sub data blocks by applying one or more transition functions on said each of said sub data blocks, wherein said transition vectors constitute a transition set for said each of said sub data blocks;
 a third computer program code for encoding one of said transition vectors in said transition set for said each of said sub data blocks for obtaining a residual sub data block comprising a reduced number of said number of said bits for said each of said sub data blocks, resulting in increased bit space for accommodating parity bits and error correction bits; and a fourth computer program code for generating a composite data block by merging said residual sub data block of said each of said sub data blocks, wherein said composite data block comprises said increased bit space provided by each said residual sub data block, and wherein said composite data block is configurable for writing said composite data block to one or more of a plurality of regions in said programmable data storage device free from a disturbance caused by a write operation to each of another one or more of said regions in said programmable data storage device.

* * * * *